(12) United States Patent
Liu et al.

(10) Patent No.: US 11,387,404 B2
(45) Date of Patent: Jul. 12, 2022

(54) MAGNETOELECTRIC SPIN ORBIT LOGIC BASED MINORITY GATE

(71) Applicant: Intel Corporation, Santa Clara, CA (US)

(72) Inventors: Huichu Liu, Santa Clara, CA (US); Tanay Karnik, Portland, OR (US); Sasikanth Manipatruni, Portland, OR (US); Daniel Morris, Hillsboro, OR (US); Kaushik Vaidyanathan, Santa Clara, CA (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 760 days.

(21) Appl. No.: 16/130,905

(22) Filed: Sep. 13, 2018

(65) Prior Publication Data

US 2020/0091407 A1    Mar. 19, 2020

(51) Int. Cl.
| | | |
|---|---|---|
| *G11C 11/00* | (2006.01) | |
| *H01L 43/02* | (2006.01) | |
| *H01L 43/10* | (2006.01) | |
| *H01L 43/06* | (2006.01) | |

(Continued)

(52) U.S. Cl.
CPC ............ *H01L 43/02* (2013.01); *G11C 11/161* (2013.01); *G11C 11/165* (2013.01); *G11C 11/18* (2013.01); *H01L 43/06* (2013.01); *H01L 43/10* (2013.01)

(58) Field of Classification Search
CPC ......... H01L 43/02; H01L 43/06; H01L 43/10; G11C 11/161; G11C 11/165; G11C 11/18; H03K 19/18
See application file for complete search history.

(56) References Cited

U.S. PATENT DOCUMENTS

| | | | |
|---|---|---|---|
| 7,259,607 B2 * | 8/2007 | Sommer | G11C 7/1072 327/291 |
| 2013/0141966 A1 | 6/2013 | Ohno et al. | |
| 2014/0169088 A1 | 6/2014 | Buhrman et al. | |

(Continued)

FOREIGN PATENT DOCUMENTS

| | | |
|---|---|---|
| WO | 2016105436 | 6/2016 |
| WO | 2017044095 | 3/2017 |

(Continued)

OTHER PUBLICATIONS

Manipatruni, et al., "Spin-Orbit Logic with Magnetoelectric Switching: A Multi Generation Scalable Charge Mediated Nonvolatile Spintronic Logic", (Submitted on Dec. 17, 2015 (v1), last revised Mar. 5, 2017 (this version, v2)) arXiv:1512.05428, 60 pages.

*Primary Examiner* — Uyen Smet
(74) *Attorney, Agent, or Firm* — Essential Patents Group, LLP

(57) ABSTRACT

An apparatus is provided which comprises one or more magnetoelectric spin orbit (MESO) minority gates with different peripheral complementary metal oxide semiconductor (CMOS) circuit techniques in the device layer including: (1) current mirroring, (2) complementary supply voltages, (3) asymmetrical transistor sizing, and (4) using transmission gates. These MESO minority gates use the multi-phase clock to prevent back propagation of current so that MESO gate can correctly process the input data.

20 Claims, 25 Drawing Sheets

(51) Int. Cl.
    *G11C 11/16*         (2006.01)
    *G11C 11/18*         (2006.01)

(56) References Cited

U.S. PATENT DOCUMENTS

| | | |
|---|---|---|
| 2014/0243917 A1 | 8/2014 | Morley et al. |
| 2015/0041934 A1 | 2/2015 | Khvalkovskiy et al. |
| 2016/0043301 A1 | 2/2016 | Butler et al. |
| 2016/0380188 A1 | 12/2016 | Hu |
| 2017/0243917 A1* | 8/2017 | Manipatruni ........ H03K 19/173 |
| 2019/0287597 A1* | 9/2019 | Koui ..................... H01L 27/228 |
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0303343 A1 | 9/2020 | Manipatruni et al. |
| 2020/0303344 A1 | 9/2020 | Manipatruni et al. |
| 2020/0321344 A1 | 10/2020 | Ramamoorthy et al. |
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |

FOREIGN PATENT DOCUMENTS

| | | |
|---|---|---|
| WO | 2017105396 | 6/2017 |
| WO | 2019005146 | 1/2019 |
| WO | 2019066820 | 4/2019 |

* cited by examiner

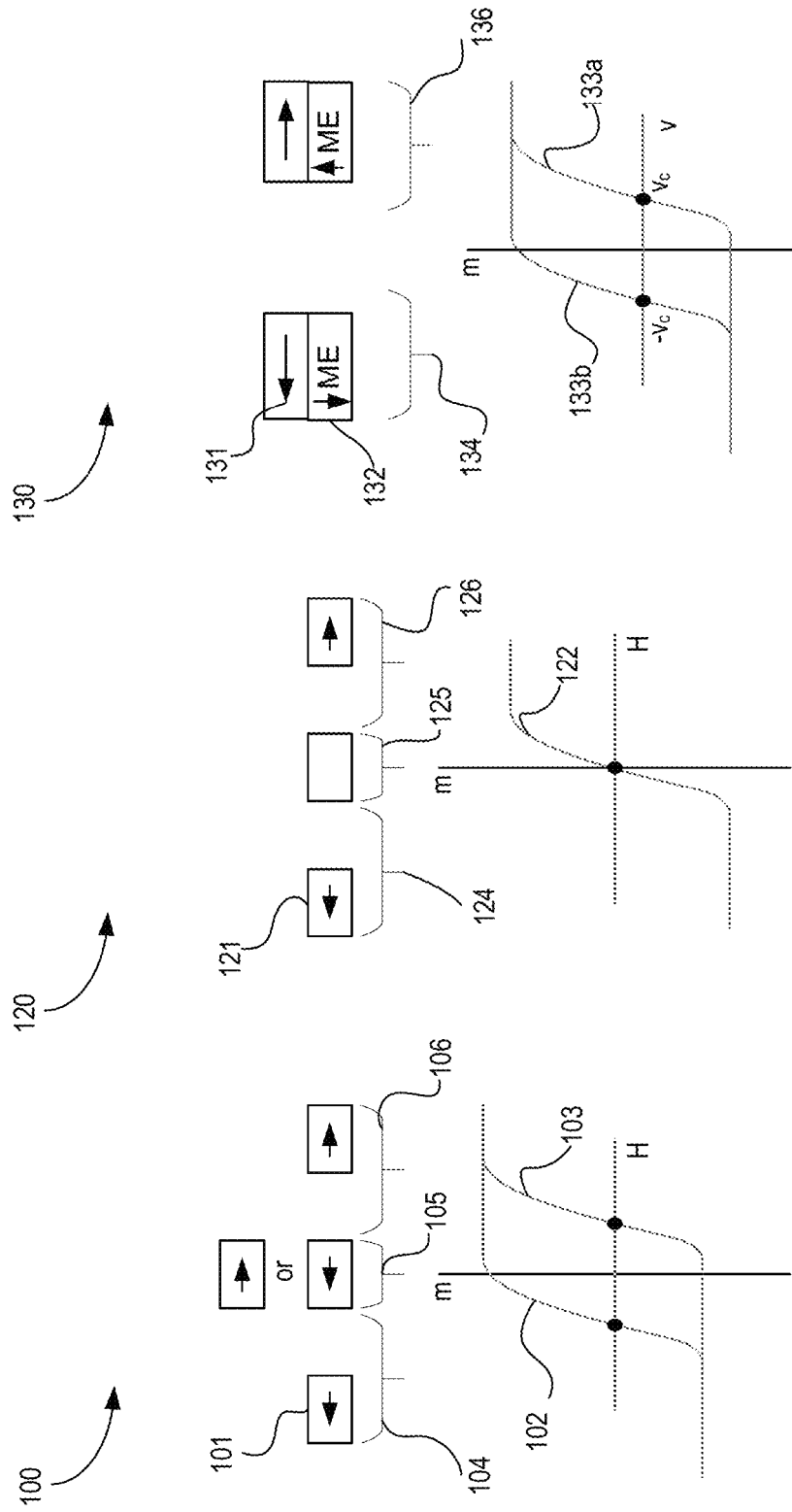

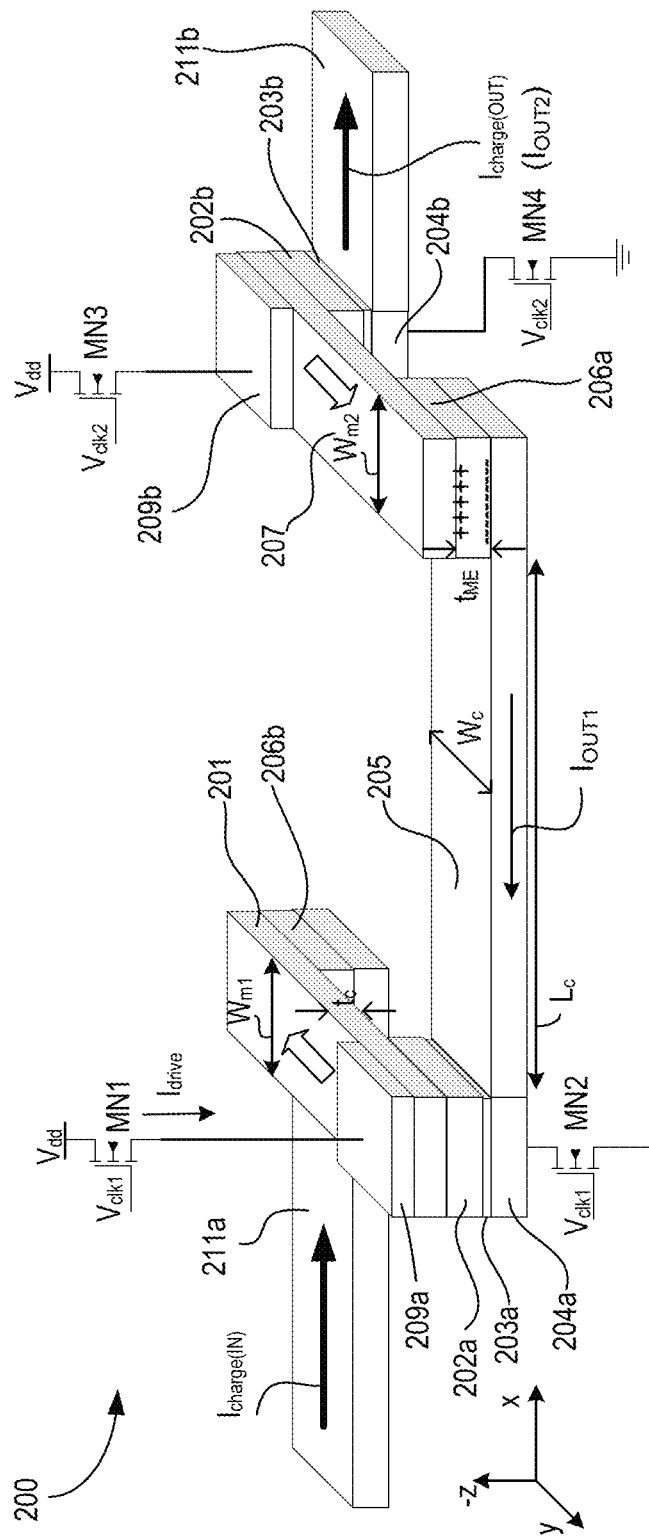
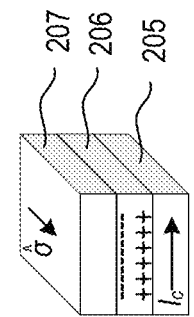
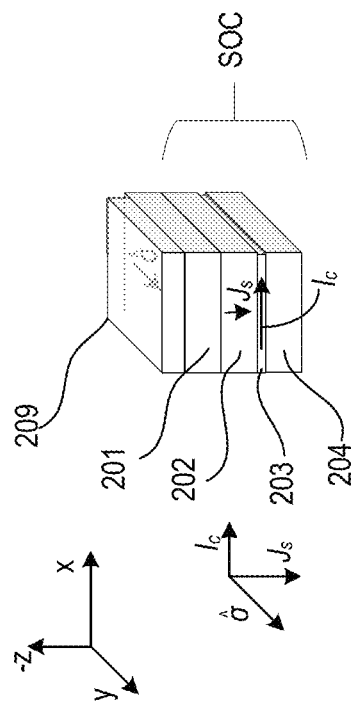
Fig. 2A
Fig. 2C
Fig. 2B

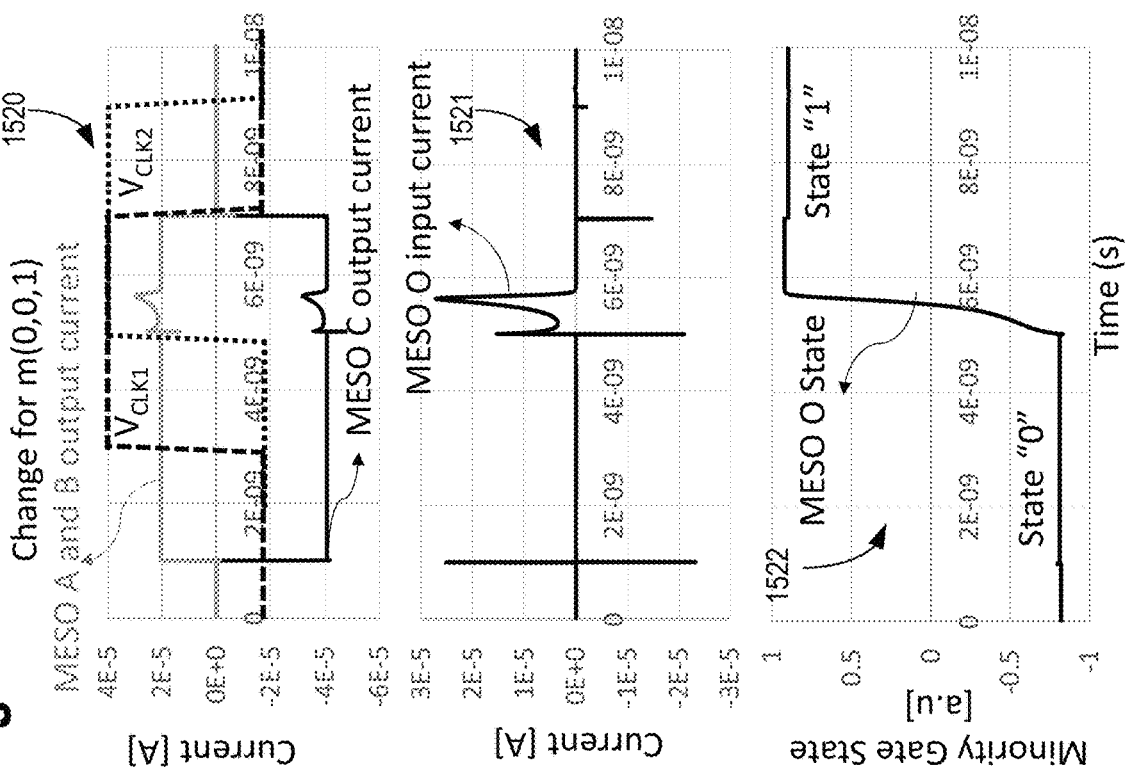
Fig. 15A. MESO O Device State Change for m(1,1,0)
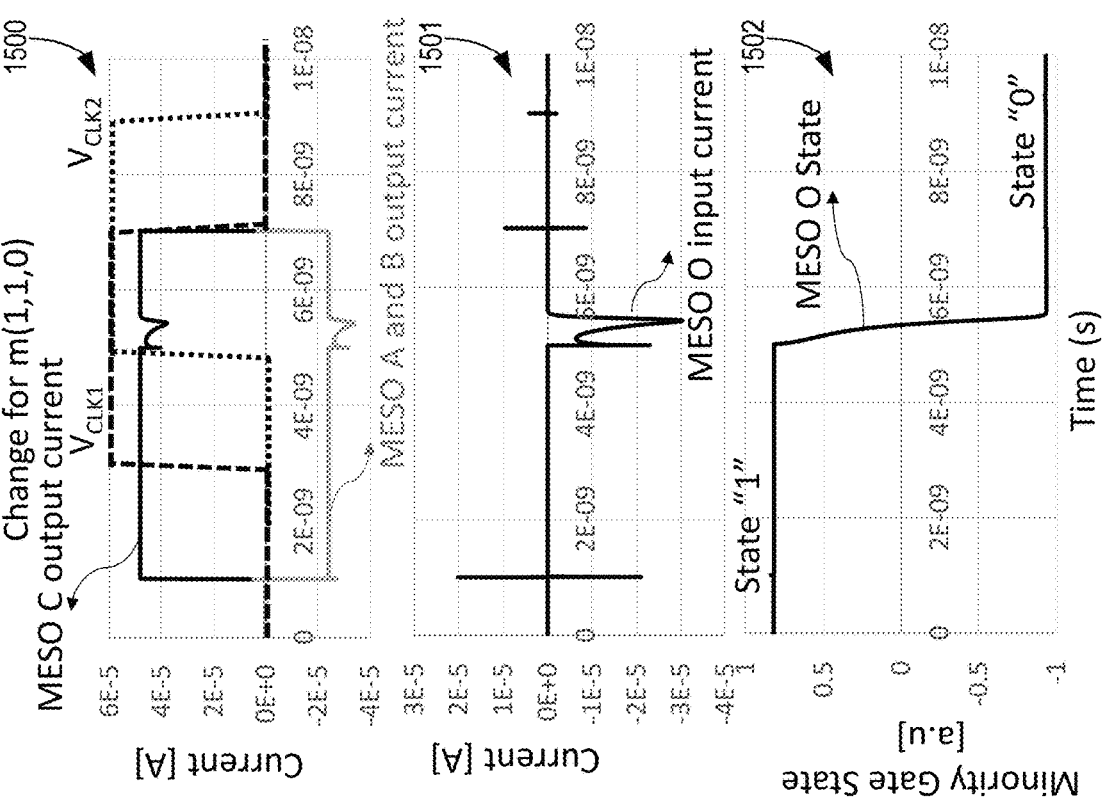
Fig. 15B. MESO O Device State Change for m(0,0,1)

US 11,387,404 B2

MAGNETOELECTRIC SPIN ORBIT LOGIC BASED MINORITY GATE

BACKGROUND

Spintronics is the study of intrinsic spin of the electron and its associated magnetic moment in solid-state devices. Spintronic logic are integrated circuit devices that use a physical variable of magnetization or spin as a computation variable. Such variables can be non-volatile (e.g., preserving a computation state when the power to an integrated circuit is switched off). Non-volatile logic can improve the power and computational efficiency by allowing architects to put a processor to un-powered sleep states more often and therefore reduce energy consumption. Existing spintronic logic generally suffer from high energy and relatively long switching times.

For example, large write current (e.g., greater than 100 µA/bit) and voltage (e.g., greater than 0.7 V) are needed to switch a magnet (i.e., to write data to the magnet) in Magnetic Tunnel Junctions (MTJs). Existing Magnetic Random Access Memory (MRAM) based on MTJs also suffer from high write error rates (WERs) or low speed switching. For example, to achieve lower WERs, switching time is slowed down which degrades the performance of the MRAM. MTJ based MRAMs also suffer from reliability issues due to tunneling current in the spin filtering tunneling dielectric of the MTJs e.g., magnesium oxide (MgO).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a magnetization response to an applied magnetic field for a ferromagnet.

FIG. 1B illustrates a magnetization response to an applied magnetic field for a paramagnet.

FIG. 1C illustrates a magnetization response to an applied voltage field for a paramagnet connected to a magnetoelectric layer.

FIG. 2A illustrates a unidirectional magnetoelectric spin orbit (MESO) logic, according to some embodiments of the disclosure.

FIG. 2B illustrates a spin orbit material stack at the input of an interconnect, according to some embodiments of the disclosure.

FIG. 2C illustrates a magnetoelectric material stack at the output of an interconnect, according to some embodiments of the disclosure.

FIGS. 15A-B illustrate plots showing simulations of MESO minority gate device of FIG. 14 having ideal current sources, in accordance with some embodiments.

DETAILED DESCRIPTION

Figure 3A:
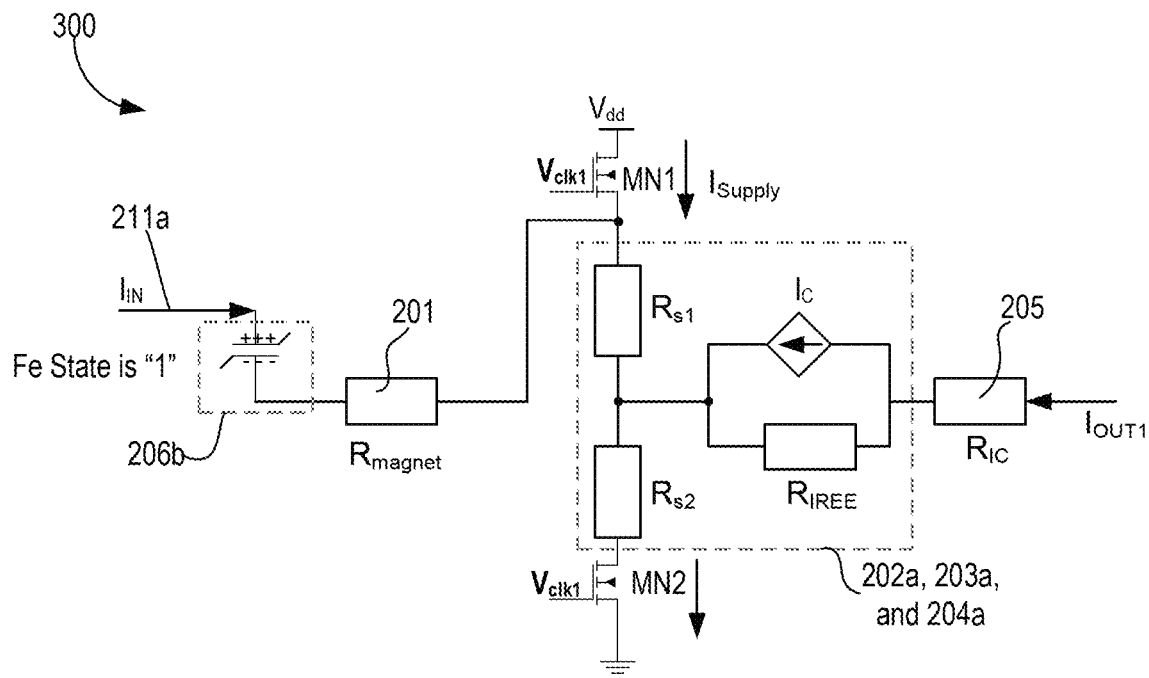
FIG. 3A illustrates an equivalent circuit model for a first section (e.g., input section) of the unidirectional MESO logic of FIG. 2A, in accordance with some embodiments.

Technology scaling is an important factor of success for the semiconductor industry, where beyond CMOS (Complementary Metal Oxide Semiconductor) technology is being considered to enable future technology scaling below 5 nm technology node. One beyond CMOS technology employs Magnetoelectric (ME) effect. The ME effect has the ability to manipulate the magnetization (and the associated spin of electrons in the material) by an applied electric field. Since an estimated energy dissipation per unit area per magnet switching event through the ME effect is an order of magnitude smaller than with spin-transfer torque (STT) effect, ME materials have the capability for next-generation memory and logic applications.

Magnetoelectric Spin Orbit (MESO) Logic devices/gates when cascaded with one another may suffer from back propagation of signals that may switch magnets unintentionally. Various embodiments describe a MESO Logic which is a combination of various physical phenomena for spin-to-charge and charge-to-spin conversion, where the MESO logic comprises an input magnet and stack of layers for spin-to-charge conversion. Spin-to-charge conversion is achieved via one or more layers with the inverse Rashba-Edelstein effect (or spin Hall effect) wherein a spin current injected from the input magnet produces a charge current. The sign of the charge current is determined by the direction of the injected spin and thus of magnetization. In some embodiments, charge-to-spin conversion is achieved via magnetoelectric effect in which the charge current produces a voltage on a capacitor, comprising a layer with magnetoelectric effect, leading to switching magnetization of an output magnet. In some embodiments, magnetic response of a magnet is according to an applied exchange bias from the magnetoelectric effect.

In some embodiments, a multi-phase clock is used with transistors to cascade multiple MESO logic devices. For example, a 3-phase clock is used to prevent back propagation of current from the output magnet towards the input magnet. In some embodiments, the clocks control the power supply of each MESO logic/device. For example, when clock phase is low, power supply is coupled to the magnet of the MESO logic/device. In some embodiments, merely two series connected MESO devices conduct while other MESO devices in the cascaded logic are prevented from conducting. As such, unidirectionality for signal propagation is achieved in the cascaded MESO logic. Further, backward propagation of current and leakage current is prevented by the transistors controlled by the multi-phase clock.

MESO logic gate is used to build MESO logic function as well as MESO based computing systems (since a computing system design requires complex logic functions). Some embodiments describe MESO based logic gates such as NAND, OR, gates, etc. These logic gates are minority logic gates in that the minority input logic values determine the logic output. Some embodiments illustrate variations of MESO minority gates with different peripheral CMOS circuit techniques in the device layer including: (1) current mirroring, (2) complementary supply voltages, (3) asymmetrical transistor sizing, and (4) using transmission gates. These MESO minority gates use the multi-phase clock to prevent back propagation of current so that MESO gate can correctly process the input data.

There are many technical effects of various embodiments. For example, high speed operation of the logic (e.g., 100 picoseconds (ps)) is achieved via the use of magnetoelectric switching operating on semi-insulating nanomagnets. In some examples, switching energy is reduced (e.g., 1-10 attojoules (aJ)) because the current needs to be "on" for a shorter time (e.g., approximately 3 ps) in order to charge the capacitor. In some examples, in contrast to the spin current, here charge current does not attenuate when it flows through an interconnect. Some embodiments solve the 2 or more inputs to a single MESO gate and enables complex logic functions with basic minority function. Compared to other majority/minority logic, MESO uses one device per minority gate. Also, since MESO logic is non-volatile, MESO logic is applied to novel non-volatile logic for ultra-low idle power consumption and more efficient power management in integrated circuits. Other technical effects will be evident from various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

Here, perpendicularly magnetized magnet (or perpendicular magnet, or magnet with perpendicular magnetic anisotropy (PMA)) refers to a magnet having a magnetization which is substantially perpendicular to a plane of the magnet or a device. For example, a magnet with a magnetization which is in a z-direction in a range of 90 (or 270) degrees +/−20 degrees relative to an x-y plane of a device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

For the purposes of present disclosure, the terms "spin" and "magnetic moment" are used equivalently. More rigorously, the direction of the spin is opposite to that of the magnetic moment, and the charge of the particle is negative (such as in the case of electron).

It is pointed out that those elements of the figures having the same reference numbers (or names) as the elements of any other figure can operate or function in any manner similar to that described, but are not limited to such.

FIG. 1A illustrates a magnetization hysteresis plot 100 for ferromagnet 101. The plot shows magnetization response to applied magnetic field for ferromagnet 101. The x-axis of plot 100 is magnetic field 'H' while the y-axis is magnetization 'm'. For ferromagnet (FM) 101, the relationship between 'H' and 'm' is not linear and results in a hysteresis loop as shown by curves 102 and 103. The maximum and minimum magnetic field regions of the hysteresis loop correspond to saturated magnetization configurations 104 and 106, respectively. In saturated magnetization configurations 104 and 106, FM 101 has stable magnetizations. In the zero magnetic field region 105 of the hysteresis loop, FM 101 does not have a definite value of magnetization, but rather depends on the history of applied magnetic fields. For example, the magnetization of FM 101 in configuration 105 can be either in the +x direction or the −x direction for an in-plane FM. As such, changing or switching the state of FM 101 from one magnetization direction (e.g., configuration 104) to another magnetization direction (e.g., configuration 106) is time consuming resulting in slower nanomagnets response time. It is associated with the intrinsic energy of switching proportional to the area in the graph contained between curves 102 and 103. Semi-insulating or insulating magnets also have a hysteresis curve, and can be used as magnets in various embodiments.

In some embodiments, FM 101 is formed of CFGG (i.e., Cobalt (Co), Iron (Fe), Germanium (Ge), or Gallium (Ga) or a combination of them). In some embodiments, FM 101 comprises one or more of Co, Fe, Ni alloys and multilayer hetero-structures, various oxide ferromagnets, garnets, or Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

FIG. 1B illustrates magnetization plot 120 for paramagnet 121. Plot 120 shows the magnetization response to applied magnetic field for paramagnet 121. The x-axis of plot 120 is magnetic field 'H' while the y-axis is magnetization 'm'. A paramagnet, as opposed to a ferromagnet, exhibits magnetization when a magnetic field is applied to it. Paramagnets generally have magnetic permeability greater or equal to one and hence are attracted to magnetic fields. Compared to plot 100, the magnetic plot 120 of FIG. 1B does not exhibit hysteresis which allows for faster switching speeds and smaller switching energies between the two saturated magnetization configurations 124 and 126 of curve 122. In the middle region 125, paramagnet 121 does not have any magnetization because there is no applied magnetic field (e.g., H=0). The intrinsic energy associated with switching is absent in this case.

In some embodiments, paramagnet 121 comprises a material which includes one or more of: Platinum (Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$ (Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), or $V_2O_3$ (Vanadium oxide). In some embodiments, paramagnet 121 comprises dopants which include one or more of: Ce, Cr, Mn, Nb, Mo, Tc, Re, Nd, Gd, Tb, Dy, Ho, Er, Tm, or Yb. In various embodiments, the magnet can be either a FM or a paramagnet.

FIG. 1C illustrates plot 130 showing magnetization response to applied voltage field for a paramagnet 131 connected to a magnetoelectric layer 132. Here, the x-axis is voltage 'V' applied across ME layer 132 and y-axis is magnetization 'm'. Ferroelectric polarization 'PFE' in ME layer 132 is indicated by an arrow. In this example, magnetization is driven by exchange bias exerted by an ME effect from ME layer 132. When positive voltage is applied to ME layer 132, paramagnet 131 establishes a deterministic magnetization (e.g., in the +x direction by voltage $+V_c$) as shown by configuration 136. When negative voltage is applied by ME layer 132, paramagnet 131 establishes a deterministic magnetization (e.g., in the −x direction by voltage $-V_c$) as shown by configuration 134. Plot 130 shows that magnetization functions 133a and 133b have hysteresis. In some embodiments, by combining ME layer 132 with paramagnet 131, switching speeds of paramagnet as shown in FIG. 1B are achieved. In some embodiments, the hysteresis behavior of FM 131, as shown in FIG. 1C, is associated with the driving force of switching rather than the intrinsic resistance of the magnet to switching.

FIG. 2A illustrates a unidirectional magnetoelectric spin orbit (MESO) logic, according to some embodiments of the disclosure. FIG. 2B illustrates a material stack at the input of an interconnect, according to some embodiments of the disclosure. FIG. 2C illustrates a magnetoelectric material stack at the output of an interconnect, according to some embodiments of the disclosure. It is pointed out that those elements of FIGS. 2A-C having the same reference numbers (or names) as the elements of any other figure can operate or function in any manner similar to that described, but are not limited to such.

In some embodiments, MESO logic 200 comprises a first magnet 201, a stack of layers (e.g., layers 202, 203, and 204, also labeled as 202a/b, 203a/b, and 204a/b), interconnecting conductor 205 (e.g., a non-magnetic charge conductor), magnetoelectric (ME) layer 206 (206a/b), second magnet 207, first contact 209a, and second contact 209b.

In some embodiments, the first and second magnets 201 and 207, respectively, have in-plane magnetic anisotropy. In some embodiments, first magnet 201 comprises first and second portions, wherein the first portion of first magnet 201 is adjacent to the stack of layers (e.g., layers 202a, 203a, and 204a), and wherein the second portion of first magnet 201 is adjacent to a magnetoelectric material stack or layer 206b. In some embodiments, second magnet 207 comprises first and second portions, wherein the first portion of second magnet 207 is adjacent to the magnetoelectric material stack or layer 206a, and wherein the second portion of second magnet 207 is adjacent to stack of layers (e.g., layers 202b, 203b, and 204b).

In some embodiments, conductor 205 (or charge interconnect) is coupled to at least a portion of the stack of layers (e.g., one of layers 202a, 203a, or 204a) and ME layer 206a. For example, conductor 205 is coupled to layer 204a of the stack.

In some embodiments, the stack of layers (e.g., layers 202a/b, 203a/b, or 204a/b) is to provide an inverse Rashba-Edelstein effect (or inverse spin Hall effect). In some embodiments, the stack of layers provides spin-to-charge conversion where a spin current Is (or spin energy JO is injected from first magnet 201 and charge current $I_c$ is generated by the stack of layers. This charge current $I_c$ is provided to conductor 205 (e.g., charge interconnect). In contrast to spin current, charge current does not attenuate in conductor 205. The direction of the charge current $I_c$ depends on the direction of magnetization of first magnet 201.

In some embodiments, the charge current $I_c$ charges the capacitor around ME layer 206a and switches its polarization. ME layer 206a exerts exchange bias on second magnet layer 207, and the direction of the exchange bias determines the magnetization of second magnet 207. The same dynamics occurs by ME layer 206b which exerts exchange bias on first magnet 201 according to input charge current on conductor 211a.

In this example, the length of first magnet 201 is Lm, the width of conductor 205 is $W_c$, the length of conductor 205 from the interface of layer 204a to ME layer 206a is $L_c$, $t_c$ is the thickness of the magnets 201 and 207, and $t_{ME}$ is the thickness of ME layer 206a. In some embodiments, conductor 205 comprises a material including one of: Graphene, Cu, Ag, Al, or Au.

In some embodiments, the input and output charge conductors (211a and 211b, respectively) and associated spin-to-charge and charge-to-spin converters are provided. In some embodiments, input charge current $I_{charge(IN)}$ (or $I_{IN}$) is provided on interconnect 211a (e.g., charge interconnect made of same material as interconnect 205). In some embodiments, interconnect 211a is coupled to first magnet 201 via ME layer 206b. In some embodiments, interconnect 211a is orthogonal to first magnet 201. For example, interconnect 211a extends in the +x direction while first magnet 201 extends in the −y direction. In some embodiments, $I_{charge(IN)}$ is converted to corresponding magnetic polarization of 201 by ME layer 206b. The materials for ME layers 206a/b are the same as the materials of ME layer 206.

In some embodiments, an output interconnect 211b is provided to transfer output charge current $I_{charge(OUT)}$ to another logic or stage. In some embodiments, output interconnect 211b is coupled to second magnet 207 via a stack of layers that exhibit spin Hall effect and/or Rashba Edelstein effect. For example, layers 202b, 203b, and 204b are provided as a stack to couple output interconnect 211b with second magnet 207. Material wise, layers 202b, 203b, and 204b are formed of the same material as layers 202a, 203a, and 204c, respectively.

In some embodiments, ME layer 206a/b forms the magnetoelectric capacitor to switch the magnets 201/207. For example, conductor 205 forms one plate of the capacitor, magnet 207 forms the other plate of the capacitor, and layer 206a is the magnetic-electric oxide that provides out-of-plane exchange bias to second magnet 207. In some embodiments, the magnetoelectric oxide comprises perpendicular exchange bias due to partially compensated anti-ferromagnetism.

In some embodiments, first magnet 201 injects a spin polarized current into the high spin-orbit coupling (SOC) material stack (e.g., layers 202a, 203a, and 204a). The spin polarization is determined by the magnetization of first magnet.

In some embodiments, the stack comprises: i) an interface 203a/b with a high density 2D (two dimensional) electron gas and with high SOC formed between 202a/b and 204a/b materials such as Ag or Bi; or ii) a bulk material 204 with high Spin Hall Effect (SHE) coefficient such as Ta, W, or Pt. In some embodiments, a spacer (or template layer) is formed between first magnet 201 and the injection stack. In some embodiments, this spacer is a templating metal layer which provides a template for forming first magnet 201. In some embodiments, the metal of the spacer which is directly coupled to first magnet 201 is a noble metal (e.g., Ag, Cu, or Au) doped with other elements from Group 4d and/or 5d of the Periodic Table. In some embodiments, first magnet 201 (and by extension first semi-insulating magnet 209a) are sufficiently lattice matched to Ag (e.g., a material which is engineered to have a lattice constant close (e.g., within 3%) to that of Ag).

Here, sufficiently matched atomistic crystalline layers refer to matching of the lattice constant 'a' within a threshold level above which atoms exhibit dislocation which is harmful to the device (for instance, the number and character of dislocations lead to a significant (e.g., greater than 10%) probability of spin flip while an electron traverses the interface layer). For example, the threshold level is within 5% (i.e., threshold levels in the range of 0% to 5% of the relative difference of the lattice constants). As the matching improves (i.e., matching gets closer to perfect matching), spin injection efficiency from spin transfer from first magnet 201 to first ISHE/ISOC stacked layer increases. Poor matching (e.g., matching worse than 5%) implies dislocation of atoms that is harmful for the device.

Table 1 summarizes transduction mechanisms for converting magnetization to charge current and charge current to magnetization for bulk materials and interfaces.

TABLE 1

| Transduction mechanisms for Spin to Charge and Charge to Spin Conversion | | |
|---|---|---|
| | Spin → Charge | Charge → Spin |
| Bulk | Inverse Spin Hall Effect | Magnetoelectric effect |
| Interface | Inverse Rashba-Edelstein Effect | Magnetoelectric effect |

In some embodiments, a transistor (e.g., n-type transistor MN1) is coupled to first contact 209a. In this example, the drain terminal of transistor MN1 is coupled to a supply $V_{dd}$, the gate terminal of transistor MN1 is coupled to a control voltage $V_{clk1}$ (e.g., a switching clock signal, which switches between $V_{dd}$ and ground), and the source terminal of transistor MN1 is coupled to first contact 209a. In some embodiments, first contact 209a is made of any suitable conducting material used to connect the transistor to the first magnet 201. In some embodiments, the current $I_{drive}$ (or $I_{SUPPLY}$) from transistor MN1 generates spin current into the stack of layers (e.g., layers 202a, 203a, and 204a).

In some embodiments, along with the n-type transistor MN1 connected to $V_{dd}$, an n-type transistor MN2 is provided, which couples layer 203a of the stack of layers (202a, 203a, and 204a) to ground. In this example, the drain terminal of transistor MN2 is coupled to layer 204a, the gate terminal of transistor MN2 is coupled to a control voltage $V_{clk1}$ (e.g., a switching clock signal, which switches between $V_{dd}$ and ground), and the source terminal of transistor MN2 is coupled to ground.

In some embodiments, n-type transistor MN3 is provided which is operable to couple power supply $V_{dd}$ to second contact 209b. In this example, the drain terminal of transistor MN3 is coupled to a supply $V_{dd}$, the gate terminal of transistor MN3 is coupled to a control voltage $V_{clk2}$ (e.g., a switching clock signal, which switches between $V_{dd}$ and ground and is of different phase than $V_{clk1}$), and the source terminal of transistor MN3 is coupled to second contact 209b. In some embodiments, second contact 209b is made of any suitable conducting material used to connect the transistor to the second magnet 207. In some embodiments, the current $I_{drive}$ from transistor MN3 generates spin current into the stack of layers (e.g., layers 202b, 203b, and 204b).

In some embodiments, along with the n-type transistor MN4 connected to $V_{dd}$, an n-type transistor MN4 is provided which couples layer 204b of the stack of layers (202b, 203b, and 204b) to ground. In this example, the drain terminal of transistor MN4 is coupled to layer 203b, the gate terminal of transistor MN4 is coupled to a control voltage $V_{clk2}$, and the source terminal of transistor MN4 is coupled to ground.

For purposes of explaining MESO logic device 200, MESO logic device can be considered to have two portions or sections. The first portion/section (or MESO input cell)

comprises components/layers from 211a to the left of conductor 205, and the second portion/section (or MESO output cell) comprises conductor 205 to layer 211b to the right. An ideal unidirectional signal propagation scenario is as follows: an input charge current drives magnet 201 while a supply charge current is injected to the spin-orbit coupling (SOC) stack (202a, 203a, 204a). The magnet 201 switches and its directionality determines the output charge current ($I_{OUT1}$) direction in conductor 205. The output current $I_{OUT1}$ of the first MESO section drives the second MESO section, which continues to switch the MESO of that section. In the absence of transistors MN2 and MN4, simply connecting the two MESO sections in series can cause the ferroelectric capacitor in the second section of the MESO to switch input magnet 201 of the first section, which disturbs the logic operation.

In some embodiments, transistors MN1 and MN2 of the first section are in series with the nanomagnet 201 and SOC stack (202a, 203a, and 204a). In some embodiments, transistors MN3 and MN4 of the second section are in series with the nanomagnet 207 and SOC stack (202b, 203b, and 204b). In some embodiments, different clock signals ($V_{clk1}$ and $V_{clk2}$) are applied to the gate terminals of the transistors, where transistors connected to the same MESO section share the same clock. The polarization direction of the ferroelectric charge in the magnet stack determines the magnetic directions of the nanomagnets 201 and 207, which determines the output current direction.

In this example, in the first MESO section, $I_{IN}$ (or $I_{charge(IN)}$) from input conductor 211a induces positive polarization charge on the bottom plate of the ferroelectric capacitor 206b and results in polarization of magnet 201. With a charge current $I_{SUPPLY}$ (or $I_{drive}$) from layer 209a to 204a, output current $I_{OUT1}$ is generated on conductor 205 which is inversed from the input. Current $I_{OUT1}$ then provides input current to the next MESO section. This current induces a negative polarization charge on the bottom plate of the ferroelectric capacitor 206a of the next MESO section. This polarization charge causes magnet 207 of the second MESO section to switch which results in the output current $I_{OUT2}$ to be in the same direction as TIN (with the same $I_{SUPPLY}$ current direction).

The following section describes the spin to charge and charge to spin dynamics. In some embodiments, the spin-orbit mechanism responsible for spin-to-charge conversion is described by the inverse Rashba-Edelstein effect in 2D electron gases. The Hamiltonian (energy) of spin-orbit coupling electrons in a 2D electron gas is:

$$H_R = \alpha_R(k \times \hat{z}) \cdot \vec{\sigma}$$

where $\alpha_R$ is the Rashba-Edelstein coefficient, 'k' is the operator of momentum of electrons, $\hat{z}$ is a unit vector perpendicular to the 2D electron gas, and $\vec{\sigma}$ is the operator of spin of electrons.

The spin polarized electrons with direction of polarization in-plane (e.g., in the xy-plane) experience an effective magnetic field dependent on the spin direction:

$$B(\hat{k}) = \frac{\alpha_R}{\mu_B}(\hat{k} \times \hat{z})$$

where $\mu_B$ is the Bohr magneton.

This results in the generation of a charge current $I_c$ in interconnect 205 proportional to the spin current $I_c$ (or $J_s$). The spin-orbit interaction by Ag and Bi interface layers 202 and 204 (e.g., the Inverse Rashba-Edelstein Effect (IREE)) produces a charge current $I_c$ in the horizontal direction given as:

$$I_c = \frac{\lambda_{IREE} I_s}{w_m}$$

where $W_m$ is width of the input magnet 201, and $\lambda_{IREE}$ is the IREE constant (with units of length) proportional to $\alpha_R$.

Alternatively, the Inverse Spin Hall Effect in Ta, W, or Pt layer 203a/b produces the horizontal charge current $I_c$ given as:

$$I_c = \frac{\Theta_{SHE} t_{SHE} I_s}{2 w_m}$$

Both IREE and ISHE effects produce spin-to-charge current conversion around 0.1 with existing materials at 10 nm (nanometers) magnet width. For scaled nanomagnets (e.g., 5 nm wide magnets) and exploratory SHE materials such as $Bi_2Se_3$, the spin-to-charge conversion efficiency can be between 1 and 2.5. The net conversion of the drive charge current $I_{drive}$ to magnetization dependent charge current is given as:

$$I_c = \pm \frac{\lambda_{IREE} P I_s}{w_m} \text{ for IREE and } I_c = \pm \frac{\Theta_{SHE} t_{SHE} P I_s}{2 w_m} \text{ for ISHE}$$

where 'P' is the dimensionless spin polarization. For this estimate, the drive current $I_{drive}$ and the charge current $I_c = I_d = 100$ µA is set. As such, when estimating the resistance of the ISHE interface to be equal to R=100Ω, then the induced voltage is equal to $V_{ISHE}$=10 mV.

The charge current $I_c$, carried by interconnect 205, produces a voltage on the capacitor of ME layer 206a comprising magnetoelectric material dielectric (such as $BiFeO_3$ (BFO) or $Cr_2O_3$) in contact with second magnet 207 (which serves as one of the plates of the capacitor) and interconnect 205 (which serves as the other of the plates of the capacitor). In some embodiments, magnetoelectric materials are either intrinsic multiferroic or composite multiferroic structures. As the charge accumulates on the magnetoelectric capacitor of ME layer 206a, a strong magnetoelectric interaction causes the switching of magnetization in second magnet 207 (and by extension second semi-insulating magnet 209b).

For the following parameters of the magnetoelectric capacitor: thickness $t_{ME}$=5 nm, dielectric constant ε=500, area A=60 nm×20 nm. Then the capacitance is given as:

$$C = \frac{\varepsilon \varepsilon_0 A}{t_{ME}} \approx 1 fF$$

Demonstrated values of the magnetoelectric coefficient is $\alpha_{ME}$~10/c, where the speed of light is c. This translates to the effective magnetic field exerted on second semi-insulating magnet 207, which is expressed as:

$$B_{ME} = \alpha_{ME} E = \frac{\alpha_{ME} V_{ISHE}}{t_{ME}} \sim 0.06T$$

This is a strong field sufficient to switch magnetization.

The charge on the capacitor of ME layer 206a is $$Q = \frac{1}{fF} \times 10 \text{ mV} = 10 \text{ aC},$$

and the time to fully charge it to the induced voltage is $$td = 10\frac{Q}{I_d} \sim 1 \text{ ps}$$

(with the account of decreased voltage difference as the capacitor charges). If the driving voltage is $V_d$=100 mV, then the energy $E_{sw}$ to switch is expressed as:

$$E_{sw} \sim 100 \text{ mV} \times 100 \mu A \times 1 \text{ ps} \sim 10 \text{ aJ}$$

which is comparable to the switching energy of CMOS transistors. Note that the time to switch $t_{sw}$ magnetization remains much longer than the charging time and is determined by the magnetization precession rate. The micromagnetic simulations predict this time to be $t_{sw}$~100 ps, for example.

In some embodiments, materials for first and second magnets 201 and 207 have saturated magnetization $M_s$ and effective anisotropy field $H_k$. Saturated magnetization $M_s$ is generally the state reached when an increase in applied external magnetic field H cannot increase the magnetization of the material. Anisotropy $H_k$ generally refers material properties that are highly directionally dependent.

In some embodiments, materials for first and second magnets 201 and 207, respectively, are non-ferromagnetic elements with strong paramagnetism which have a high number of unpaired spins but are not room temperature ferromagnets. A paramagnet, as opposed to a ferromagnet, exhibits magnetization when a magnetic field is applied to it. Paramagnets generally have magnetic permeability greater or equal to one and hence are attracted to magnetic fields. In some embodiments, magnet contacts 209a/b comprise a material which includes one or more of: Platinum (Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$ (Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), or $V_2O_3$ (Vanadium oxide). In some embodiments, the first and second paramagnets 201 and 207 comprise dopants selected from a group which includes one or more of: Ce, Cr, Mn, Nb, Mo, Tc, Re, Nd, Gd, Tb, Dy, Ho, Er, Tm, or Yb.

In some embodiments, first and second magnets 201 and 207, respectively, are ferromagnets. In some embodiments, first and second magnets 201 and 207, respectively, comprise one or a combination of materials which includes one or more of: a Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, V, Ru, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, MnGaRu, or $Mn_3X$, where 'X' is one of Ga or Ge.

In some embodiments, the stack of layers providing spin orbit coupling comprises: a first layer 202a/b comprising Ag, wherein the first layer is adjacent to first magnet contact 209a/b; and a second layer 204a/b comprising Bi or W, wherein second layer 204a/b is adjacent to first layer 202a/b and to a conductor (e.g., 205, 211b). In some embodiments, a third layer 203a/b (having material which is one or more of Ta, W, or Pt) is sandwiched between first layer 202a/b and second layer 204a/b as shown. In some embodiments, the stack of layers comprises a material which includes one of: β-Ta, β-W, W, Pt, Cu doped with Iridium, Cu doped with Bismuth, or Cu doped an element of 3d, 4d, 5d, 4f, or 5f of periodic table groups.

ME materials may be divided into three categories. The first category of materials provide polarization and anti-ferromagnetization. These materials include Bismuth ferrite (BFO), Lithium Iron Oxide (LFO) super lattice. The second category of materials also provides polarization and anti-ferromagnetization, but at low temperatures. These materials include $TbMnO_3$ and similar multiferroic materials. The third category of materials are magnetoelectric para-electrics. These magnetoelectric para-electrics materials lack polarization, but provide anti-ferromagnetization. The magnetoelectric para-electrics materials include chromia ($Cr_2O_3$).

In some embodiments, ME layer 206a/b comprises one of: dielectric, para-electric, or ferro-electric material. In some embodiments, ME layer 206a/b is formed of a material which includes one of: $Cr_2O_3$ and multiferroic material. In some embodiments, ME layer 206 comprises Cr and O. In some embodiments, the multiferroic material comprises BFO (e.g., $BiFeO_3$), LFO ($LuFeO_2$, $LuFe_2O_4$), or La doped $BiFeO_3$. In some embodiments, the multiferroic material includes one of: Bi, Fe, O, Lu, or La.

In some embodiments, first contact 209a is replaced with a first semi-insulating magnet 209a, and second contact 209b is replaced with a second semi-insulating magnet 209b. In some embodiments, first semi-insulating magnet 209a is adjacent to first magnet 201 and is also coupled to a transistor (e.g., n-type transistor MN1). As such, first semi-insulating magnet 209a functions as a displacement capacitor between the transistor MN1 and the first magnet 201. Here the term "semi-insulating magnet" generally refers to a material that has magnetic properties but has higher resistivity compared to normal ferromagnets. For example, semi-insulating or insulating magnets may not be conductive for charge current, but exhibit magnetic properties. The semi-insulating magnet or insulating magnet may have a Spinel crystal structure, can be hexagonal (e.g., $Fe_2O_3$), or they can belong to any of the crystal classes. In some embodiments, materials for semi-insulating or insulating magnets include one of: $Fe_2O_3$, $Co_2O_3$, $Co_2FeO_4$, or $Ni_2FeO_4$. In some embodiments, elements for semi-insulating or insulating magnets include one or more of: Fe, O, Co or Ni. The direction of the charge current $I_c$ also depends on the direction of magnetization of first semi-insulating magnet 209a.

In some embodiments, first semi-insulating magnet 209a and second semi-insulating magnet 209b form displacement capacitors. The nature of the displacement capacitor may be set by the leakage and the dielectric constants of the semi-insulating magnets 209a/b. In some embodiments, first semi-insulating magnet 209a and second semi-insulating magnet 209b form dielectric capacitors, where a bound charge is generated at the plates.

In some embodiments, first and second semi-insulating magnets 209a and 209b, respectively, comprise a material which includes one or more of: Co, Fe, No, or O. In some embodiments, the first and second semi-insulating magnets 209a and 209b, respectively, comprise a material which includes one or more of: $Co_2O_3$, $Fe_2O_3$, $Co_2FeO_4$, or $Ni_2FeO_4$. In some embodiments, first and second semi-insulating magnets 209a and 209b have Spinel crystal structure. In some embodiments, magnets 209a and 209b have non-insulating properties. For example, magnets 209a and 209b can be paramagnets or ferromagnets.

In some embodiments, the magnetization of first semi-insulating magnet 209a is determined by the magnetization of first magnet 201. For example, when first magnet 201 has magnetizations pointing in −y direction, then first semi-insulating magnet 209a has magnetization pointing in the −y direction. In some embodiments, the magnetization of second semi-insulating magnet 209b is determined by the magnetization of second magnet 207. For example, when second magnet 207 has magnetizations pointing in −y direction, then second semi-insulating magnet 209b has magnetization pointing in the −y direction. In some embodiments, second semi-insulating magnet 209b is adjacent to second magnet 207 such that second magnet 207 is between second semi-insulating magnet 209b and the stack of layers providing spin orbit coupling.

While various embodiments are illustrated with n-type transistors MN1, MN2, MN3, and MN3, p-type transistors can be used instead and the switching gate signals can be logically inversed. In some embodiments, a combination of n-type and p-type transistors are used. For example, the transistors coupled to power supply $V_{dd}$ are p-type transistors while the transistors coupled to ground are n-type transistors. Appropriate logic change can be made to the driving gate signals to achieve the same technical effect (e.g., unidirectionality) as achieved by the n-type transistors MN1, MN2, MN3, and MN3. In some embodiments, a combination of n-type and p-type devices (e.g., transmission gates) can be used instead of n-type transistors MN1, MN2, MN3, and MN3.

FIG. 3A illustrates an equivalent circuit model 300 for the first section (or MESO input cell) of the unidirectional MESO logic of FIG. 2A, in accordance with some embodiments. Here $R_{magnet}$, $R_{s1}$, $R_{s2}$, $R_{IREE}$ and $R_{IC}$ are the modeled resistances for magnet 201, SOC stack (202a, 203a, 204a) shunt resistance, the Inverse Rashba-Edelstein Effect (IREE) resistance, and interconnect resistance of conductor 205, respectively. In some embodiments, the IREE effect from the current in the SOC stack is modeled as a current controlled current source, of which the current direction is determined by the magnet "state" (e.g., the nano-magnet direction, which is inconsistent with the polarization charge in the ferroelectric). In some embodiments, the ferroelectric 206b is modeled as a non-linear capacitor using Landau Khalatnikov (LK) equations.

Figure 3B:
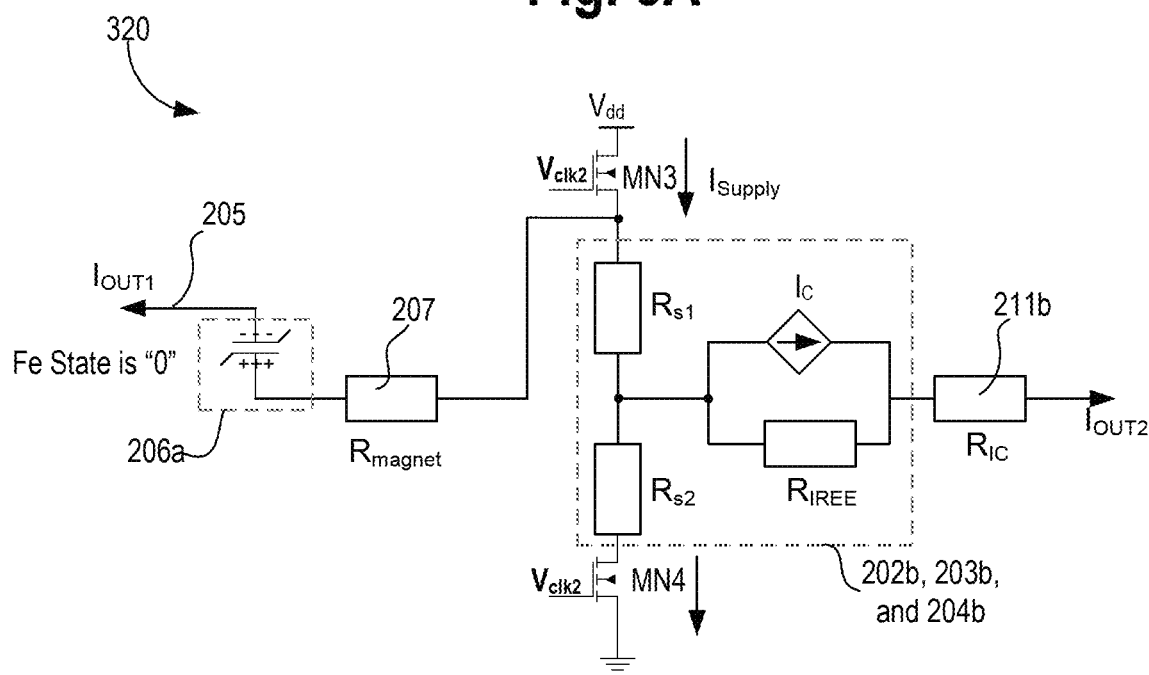
FIG. 3B illustrates an equivalent circuit model for a second section (e.g., output section) of the unidirectional MESO logic of FIG. 2A, in accordance with some embodiments.

FIG. 3B illustrates an equivalent circuit model 320 for the second section (e.g., MESO output cell) of the unidirectional MESO logic of FIG. 2A, in accordance with some embodiments. Here $R_{magnet}$, $R_{s1}$, $R_{s2}$, $R_{IREE}$ and $R_{IC}$ are the modeled resistances for magnet 207, SOC stack (202b, 203b, 204b) shunt resistance, the Inverse Rashba-Edelstein Effect (IREE) resistance, and interconnect resistance of conductor 211b, respectively. In some embodiments, the IREE effect from the current in the SOC stack is modeled as a current controlled current source, of which the current direction is determined by the magnet "state" (e.g., the nano-magnet direction, which is inconsistent with the polarization charge in the ferroelectric). In some embodiments, the ferroelectric 206a is modeled as a non-linear capacitor using LK equations. In some embodiments, to enable the unidirectional signal propagation, $V_{clk1}$ and $V_{clk2}$ are out-of-phase and with overlap. In some embodiments, Vat' and $V_{clk2}$ are out-of-phase and non-overlapping. For example, $V_{clk1}$ and $V_{clk2}$ are out-of-phase by 180°.

Figures 4A, 4B:
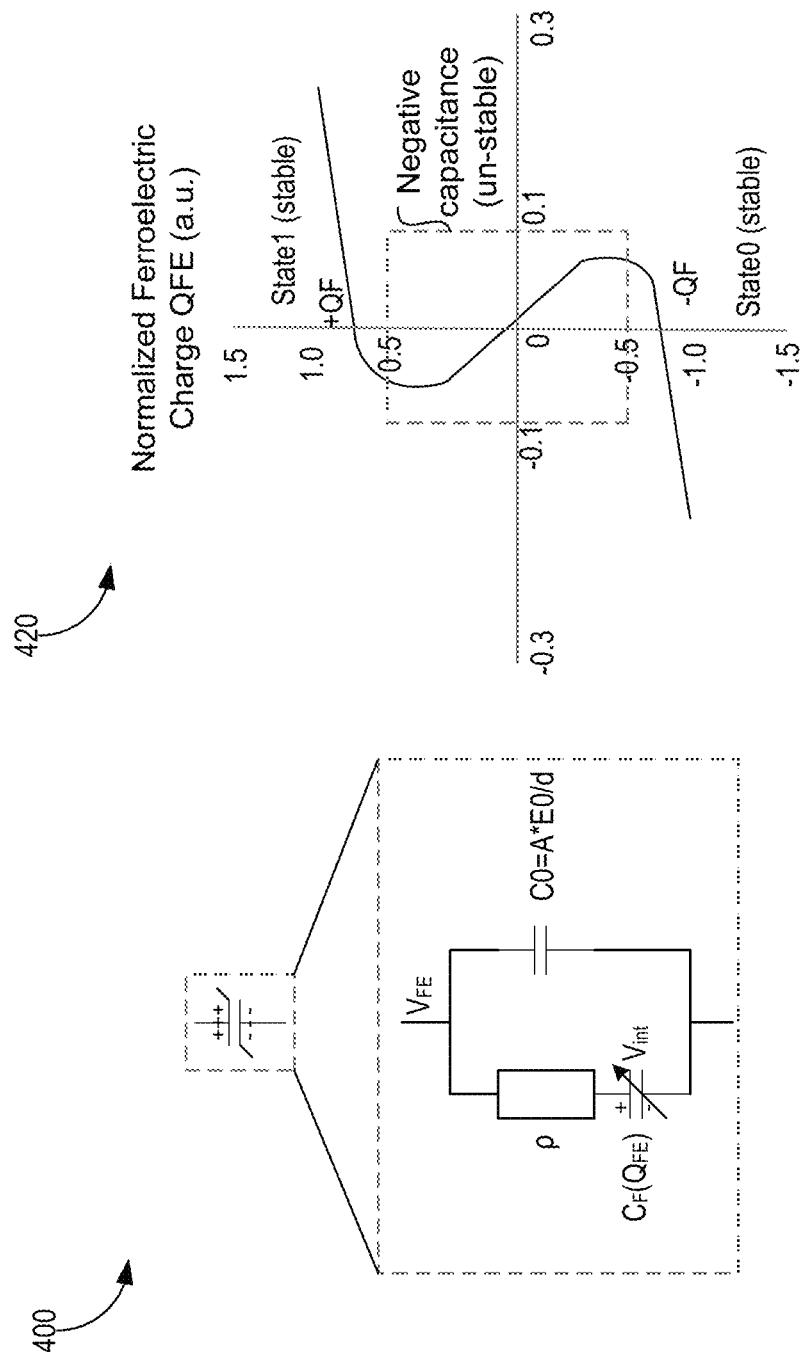
FIGS. 4A-B illustrate a ferroelectric Landau Khalatnikov (LK) model and corresponding plot showing two ferroelectric states.

FIGS. 4A-B illustrate a ferroelectric Landau Khalatnikov (LK) model 400 and corresponding plot 420, respectively, showing two ferroelectric states. In some embodiments, positive polarization charge +QF corresponds to state '1' of the magnet, while negative polarization charge −QF corresponds to state '0' of the magnet. Here, normalized +QF(1) and −QF(−1) are used in circuit simulation to indicate the ferroelectric states.

LK model 400 illustrates a circuit that provides ferroelectric voltage $V_{FE}$ and comprises capacitor C0 in parallel with a series coupled resistance p and internal capacitance $C_F(Q_{FE})$ that provides internal voltage $V_{int}$. Here, 'A' is the area of capacitor C0, 'd' is the distance between the plates of capacitor C0, and E0 is the dielectric constant. Plot 420 shows the capacitance behavior of a ferroelectric capacitor (FE-Cap) when connected with a load capacitor. Here, x-axis is the internal voltage $V_{int}$ in volts, while the y-axis is charge from the ferroelectric capacitor when connected with a load capacitor. The dotted region in plot 420 represents the negative capacitance region between the coercive voltage bounds.

When a voltage source drives the FE-Cap connected with a load capacitor, the operating region of an FE-cap is biased by the load capacitance. When the FE-Cap is biased at the negative capacitance region (e.g., charge on FE-cap is positive while the voltage across the FE-cap is negative, and vice versa), the voltage across the load capacitance can be higher than the input voltage, owning to the ferroelectric polarity charge induced voltage amplification effect. On the other hand, when the FE-Cap is biased at the positive capacitance region, it operates as a regular capacitor. The negative capacitance effect has been mainly utilized for transistor gate stack enhancement (e.g., negative capacitance FETs) for low-voltage transistors. Some embodiments use the concept of negative capacitance to a MESO logic to enhance the switching of magnets via the magnetoelectric layer.

Figure 5:
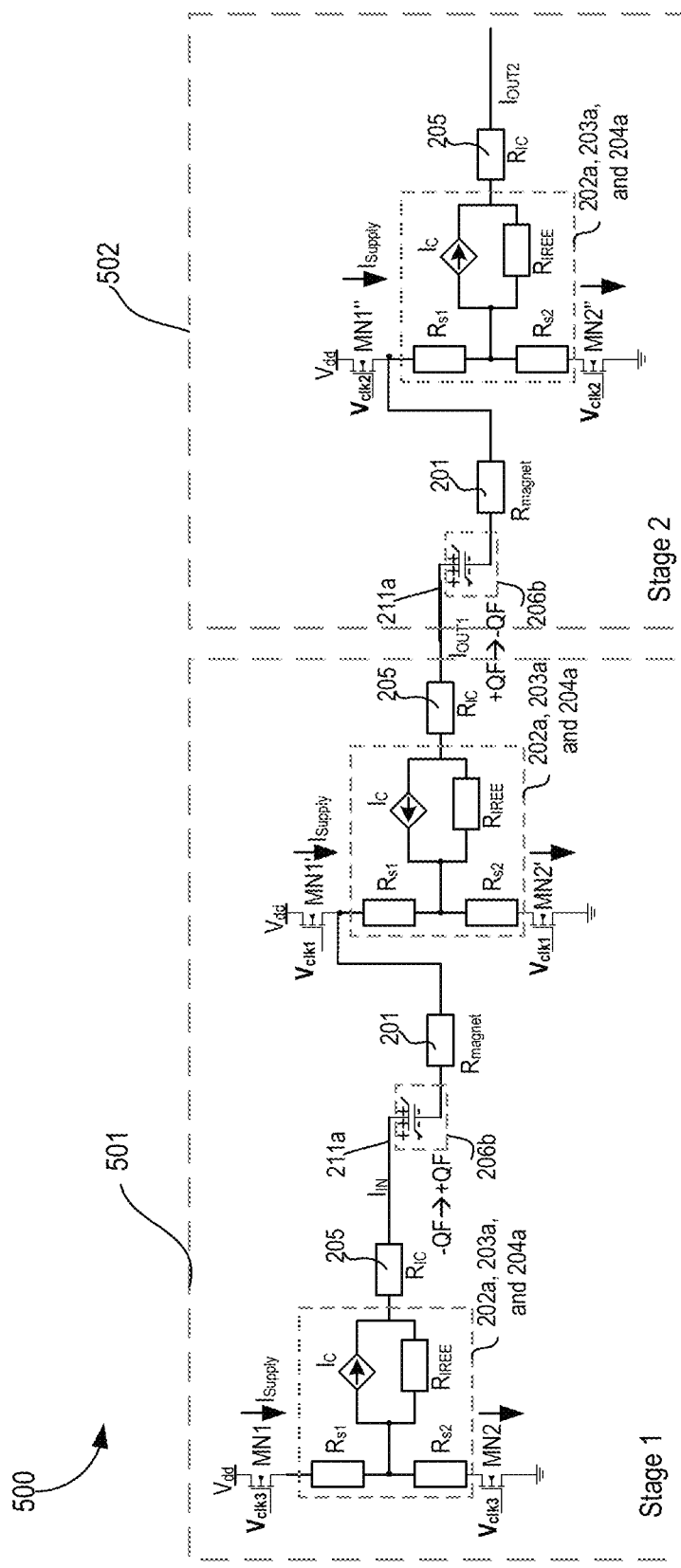
FIG. 5 illustrates a unidirectional cascaded MESO logic, according to some embodiments of the disclosure.

FIG. 5 illustrates a unidirectional cascaded MESO logic 500, according to some embodiments of the disclosure. In this example, MESO logic 500 comprises two MESO stages 501 and 502 that are cascaded with one another. To drive the MESO logic 500, three different clocks are used to drive the transistor pairs—MN1, MN2; MN1', MN2'; and MN1", MN2"—to ensure unidirectional flow of current and integrity of logic operation.

In some embodiments, $V_{clk3}$ is applied to control the input drivers (gates of transistors MN1 and MN2) of MESO stage 501. In some embodiments, the input driver provides a positive current IN to the first ferroelectric capacitor 206b. In this example, $V_{DD}$ of 100 mV and $V_{clk1}$, $V_{clk2}$, $V_{clk3}$ of 1 V with 12 ns (nanoseconds) clock period are used. In some embodiments, two out of the three clocks ($V_{clk1}$, $V_{clk2}$, $V_{clk3}$) have an overlap of $\frac{1}{3}^{rd}$ clock high duration (e.g., t=2 ns). However, the overlap can be $\frac{1}{4}^{th}$ of clock high duration or other fractions that allow unidirectional flow of current and integrity of logic operation. In the initial condition, ferroelectric capacitor 206b of MESO stage 501 has negative charge −QF (MESO1·$Q_{FE}$=−1) and ferroelectric capacitor 206b of MESO stage 502 has positive charge +QF (MESO2·$Q_{FE}$=+1), which indicate their magnet states of '0' and '1', respectively.

Figure 6:
FIG. 6 illustrates a plot showing transient simulation of the unidirectional cascaded MESO logic of FIG. 5, according to some embodiments of the disclosure.

FIG. 6 illustrates plot 600 (which includes sub-plots 601, 602, and 603) showing transient simulation of the unidirectional cascaded MESO logic of FIG. 5, according to some embodiments of the disclosure. Sub-plot 601 illustrates $V_{clk1}$, $V_{clk2}$, and $V_{clk3}$ which are control voltages to the drive transistors. Here, y-axis is voltage and x-axis is time. From time 0 ns to 1 ns, $V_{clk1}$=$V_{clk2}$=$V_{clk3}$=0. As such, all the drive transistors are off and no current flows, and the states of the magnets are unchanged. From time 1 ns to 5 ns, $V_{clk1}$=$V_{clk2}$=0, $V_{clk3}$=1. As such the first input driver has a DC current path to its ground via transistors MN1 and MN2, while other transistors MN1', MN2', MN1", and MN2" are off. Because $I_{SUPPLY}$ is off for MESO devices, no transient current flows (e.g., $I_{IN}$=0).

During time t0 (e.g., 5 ns to 7 ns), $V_{clk1}$=$V_{clk3}$=1, $V_{clk1}$=0, $I_{SUPPLY}$ of MESO stage 501 is on while $I_{SUPPLY}$ of MESO stage 502 is off. The ferroelectric 206b in MESO stage 501 (MESO1.Fe) has a transient current path from the input driver $V_{DD}$ to the ground of MESO stage 501, while the transient conduction path from MESO stage 501 to MESO stage 502 through $I_{OUT1}$ is off. In this example, ferroelectric 206b of MESO stage 501 switches from −QF to +QF due to positive current IN, while the ferroelectric 206b of MESO stage 502 is unchanged.

During time t1 (e.g., 7 ns to 9 ns), $V_{clk3}$=$V_{clk2}$=0, $V_{clk1}$=1, ferroelectrics 206b of MESO stages 501 and 502 are isolated since no conducting path exists. During time t2, $V_{clk1}$=$V_{clk2}$=1, $V_{clk3}$=0, a transient current path exists from $V_{dd}$ of MESO stage 501 to ground of MESO stage 502. Since +QF is deposited on ferroelectric 206b of MESO stage 501 (MESO1·QFe) during time t0, a negative transient current $I_{OUT1}$ is generated due to IREE and discharges ferroelectric 206b of MESO stage 501 (MESO2·QFe). As such, magnet 201 of MESO stage 502 switches from state '1' to state '0' with negative polarization charge. Note that magnet 201 of MESO stage 501 switches when $V_{clk3}$ and $V_{clk1}$ overlap (e.g., at t0), and magnet 201 of MESO stage 502 switches when $V_{clk1}$ and $V_{clk2}$ overlap (e.g., t2). In some embodiments, each magnet 201 of a MESO stage switches once during one clock period. As such, choosing proper clock signals can enable cascaded MESO circuits in accordance with various embodiments. In some embodiments, as more MESO stages are cascaded, more clocks may be used to ensure unidirectional flow of current. In some embodiments, when propagated voltage through a MESO stage is less than a threshold of the ferroelectric capacitor, then no more clocks are used because unidirectionality is preserved.

Figure 7:
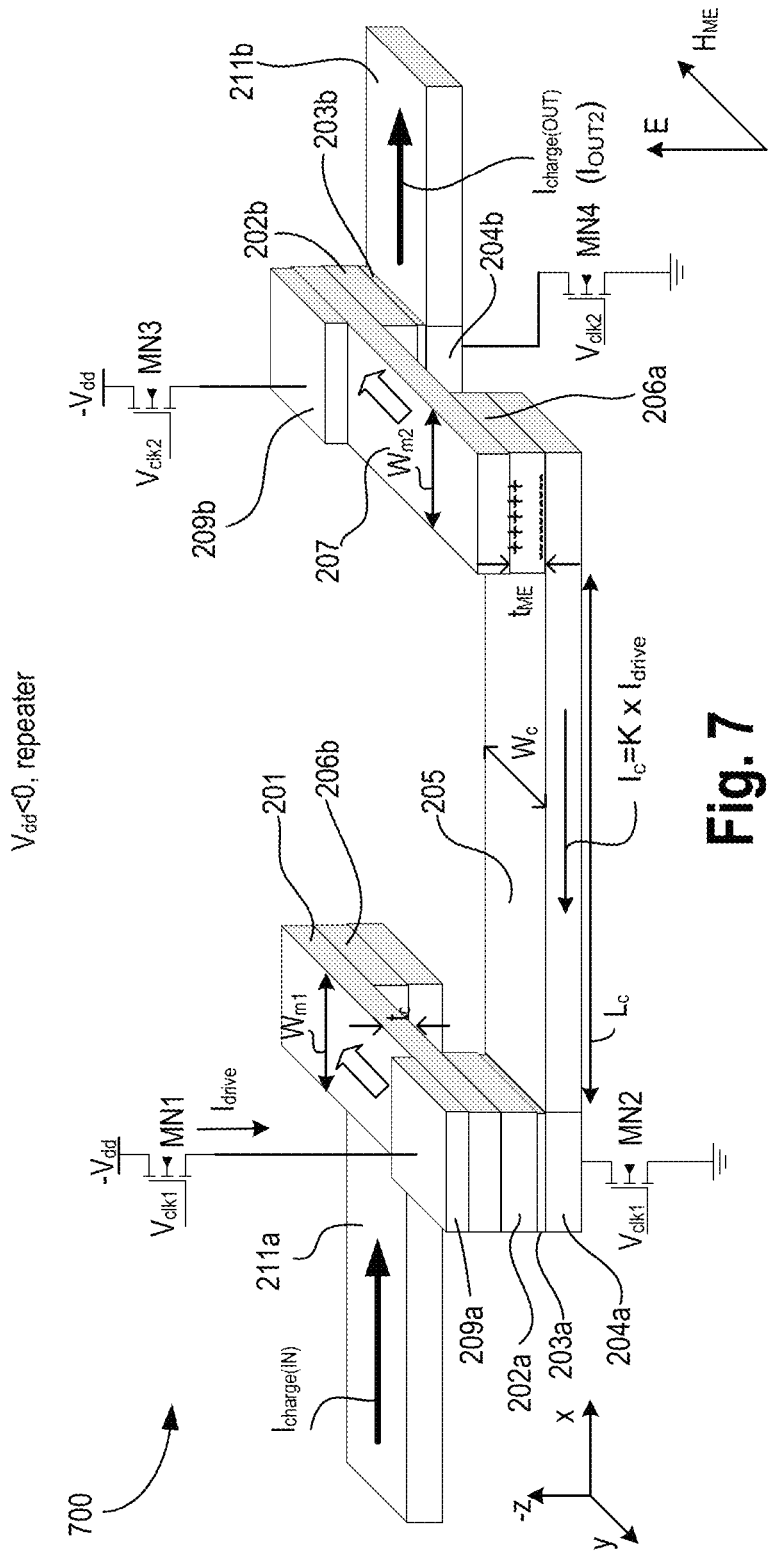
FIG. 7 illustrates a MESO logic operable as a repeater, according to some embodiments.

FIG. 7 illustrates a MESO logic 700 operable as a repeater, according to some embodiments. In some embodiments, to configure the MESO logic as a repeater, a portion of the stack of the layers (e.g., layer 204) is coupled to ground, contact 209b is coupled to a negative supply (e.g., −$V_{dd}$). In some embodiments, for repeater MESO logic 700, the magnetization direction of first magnet 201 is the same as the magnetization direction of second magnet 207. For example, the magnetization direction of first magnet 201 is in the +y direction while the magnetization direction of second magnet 207 is also in the +y direction.

Figure 8:
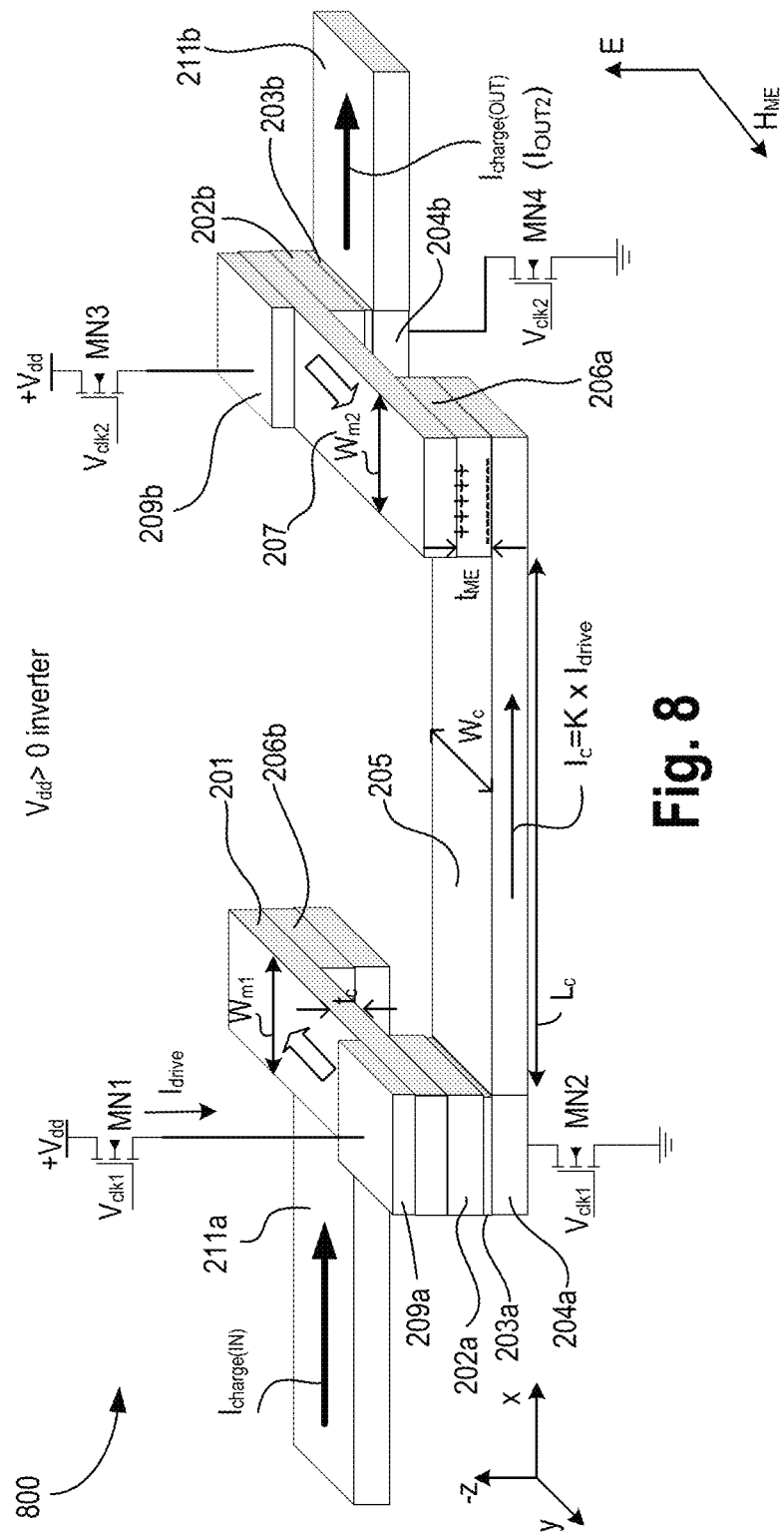
FIG. 8 illustrates a MESO logic operable as an inverter, according to some embodiments.

FIG. 8 illustrates a MESO logic 800 operable as an inverter, according to some embodiments. In some embodiments, to configure the MESO logic as an inverter, a portion of the stack of the layers (e.g., layer 204) is coupled to ground, contact 209b is coupled to a positive supply (e.g., +$V_{dd}$). In some embodiments, for inverter MESO logic 800, the magnetization direction of first magnet 201 is opposite compared to the magnetization direction of second magnets 207. For example, the magnetization direction of first magnet 201 is in the +y direction while the magnetization direction of second magnet 207 is in the −y direction.

Figure 9:
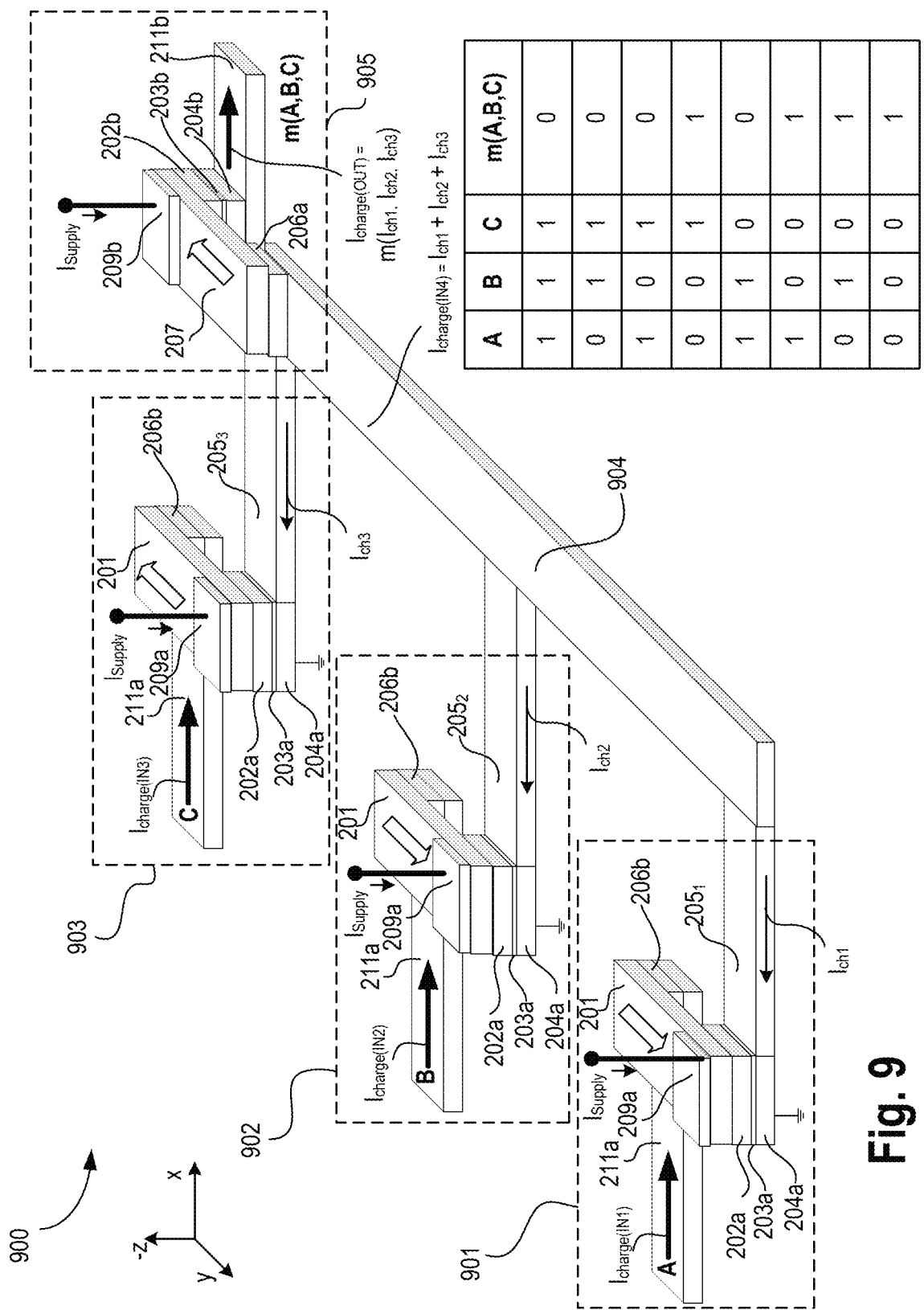
FIG. 9 illustrates a 3-input MESO minority gate device, in accordance with some embodiments.

FIG. 9 illustrates a 3-input MESO minority gate device 900, in accordance with some embodiments. Device 900 comprises three MESO input cells 901, 902, and 903; common interconnect 904; and a MESO output cell 905. Conductors $205_{1-3}$ of each MESO input cell is coupled to the common interconnect 904. As discussed herein, the output current direction of the MESO device depends on the MESO logic state (e.g. ferromagnet state "1" and "0", or ferroelectric charge polarization state "+Q" and "−Q" in the ME structures). Because the output $I_{charge(OUT)}$ of MESO device is charge current, connecting three MESO devices' output at the interconnect layer 905 to the input of the fourth MESO device 904 leads to the current summation operation at the input ME capacitor 206a of the fourth MESO device 905.

In FIG. 9, the MESO based 3-input minority gate has a supply current ($I_{supply}$) in z direction. Here m(A,B,C) denotes the output of a minority function for inputs A, B and C. The inputs A, B, and C may correspond to input charge current $I_{charge\ (IN1)}$, $I_{charge\ (IN2)}$, and $I_{charge\ (IN3)}$, respectively, or to the magnetization direction of magnets 201 of each MESO input cell 901, 902, and 903, respectively. The inputs A, B, and C may also refer to magnetization states of magnets 201 of the respective input MESO cells. For example, magnetization of magnet 201 in the +y direction is State "0" while magnetization of magnet 201 in the −y direction is State "1".

The operation principle of the MESO minority gate 900 is as follows. When states A and B of input MESO cell 901 and 902 are in State "0" (−QF, magnetization in +y-axis direction) and state C of input MESO cell 903 is in State "1" (+QF, magnetization in −y-axis direction), MESO cells 901 and 902 generate output current $I_{ch1}$ and $I_{ch2}$, respectively, along +x-axis direction, MESO cell 903 generates −x-axis direction. The summation of the output current of MESO devices 901, 902, and 903 generates a current $I_{charge(IN4)}$ in the same direction (e.g., +x-axis direction) as the output current of MESO 901 or 902, assuming near symmetric output current magnitude for State "1" and State "0". The summation of the output current from conductors $205_{1-3}$ $I_{charge(IN4)}$ then deposits positive charge in MESO device 905 at its input node (or interconnect) 904, switching magnet 207 of MESO 905 to State "1". The resulting MESO 905's state is the same state C of MESO 903, which is the "minority" state among A, B and C. The truth table of the 3-input MESO minority gate is shown in FIG. 9 which elaborates the minority gate function.

Figure 10:
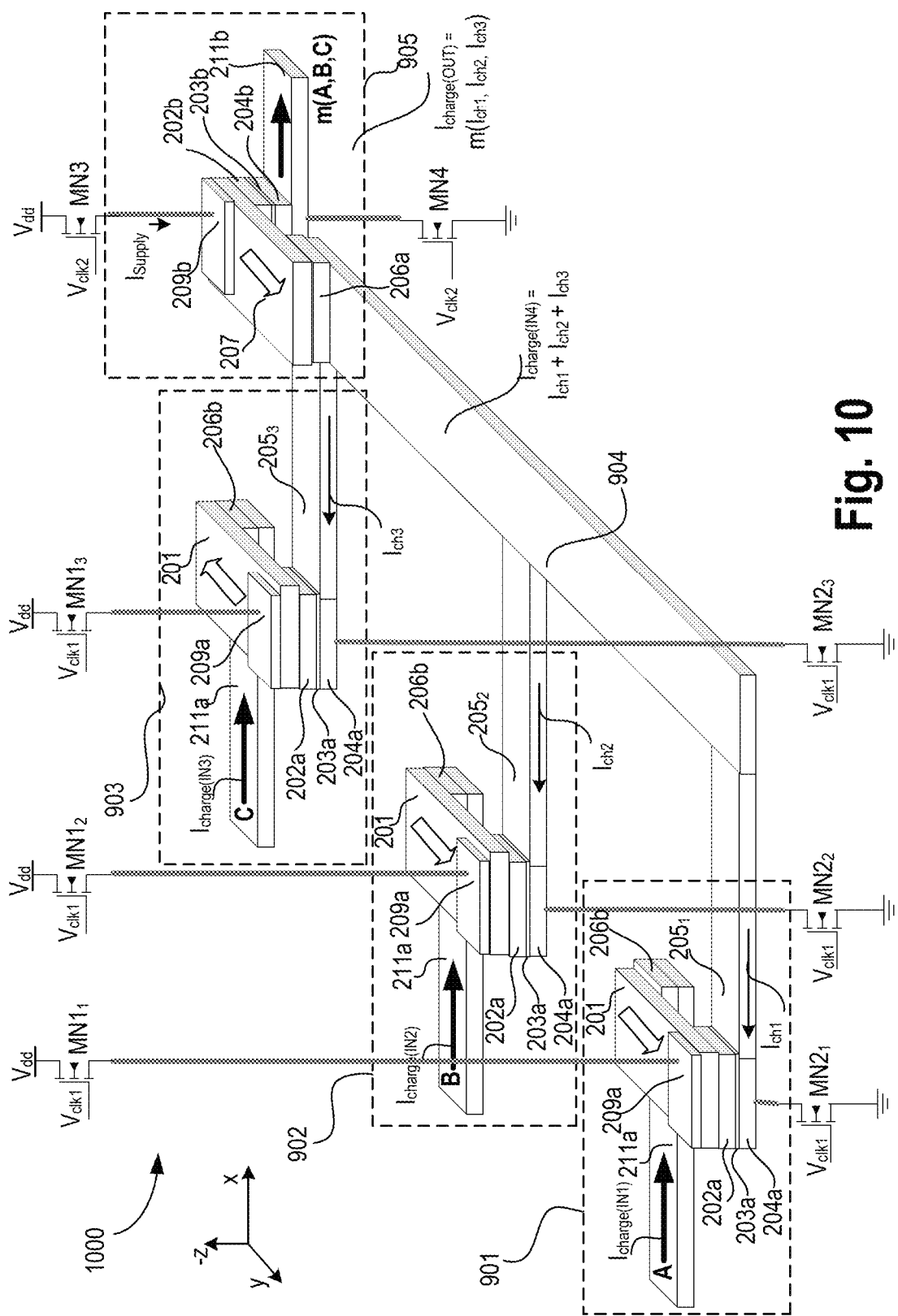
FIG. 10 illustrates a 3-input MESO minority gate device with two-phase clocking circuitry to control logic computation, in accordance with some embodiments.

FIG. 10 illustrates a 3-input MESO minority gate device 1000 with a two-phase clocking circuitry to control logic computation, in accordance with some embodiments. To enable proper minority logic gate function and to avoid backward propagation of charge from output MESO cell 905 to the input MESO cells 901, 902, and 903, a two-phase clocking output conductor 211b scheme is employed as described with reference to FIGS. 2-6. In some embodiments, n-type transistors MN1 and MN2, controllable by clock 1 ($V_{CLK1}$) are used to control the propagation of input charge current to output conductor 205, while n-type transistors MN3 and MN4, controllable by clock 2 ($V_{CLK2}$) are used to generate the output current according to the state of the output MESO cell 905 and control the propagation of the minority state to the next stage. The output current $I_{charge}$ (OUT) of output MESO cell 905 equals to the minority of currents $I_{ch1}$, $I_{ch2}$ and $I_{ch3}$ (e.g., $m(I_{ch1}, I_{ch2}, I_{ch3})$).

For MESO input cell 901, the input magnet 201 is coupled to supply $V_{dd}$ via contact 209a and n-type transistor $MN1_1$ controllable by $V_{CLK1}$ while one of the SOC stack layers 204a is coupled to ground via n-type transistor $MN2_1$ controllable by $V_{CLK1}$. For MESO input cell 902, the input magnet 201 is coupled to supply $V_{dd}$ via contact 209a and n-type transistor MN12 controllable by $V_{CLK1}$ while one of the SOC stack layers 204a is coupled to ground via n-type transistor MN22 controllable by $V_{CLK1}$. For MESO input cell 903, the input magnet 201 is coupled to supply $V_{dd}$ via contact 209a and n-type transistor MN13 controllable by $V_{CLK1}$ while one of the SOC stack layers 204a is coupled to ground via n-type transistor MN23 controllable by $V_{CLK1}$. For MESO output cell 905, the output magnet 207 is coupled to supply $V_{dd}$ via contact 209b and n-type transistor MN3 controllable by $V_{CLK2}$ while one of the SOC stack layers 204b is coupled to ground via n-type transistor MN4 controllable by $V_{clk2}$. The two clocks $V_{CLK1}$ and $V_{CLK2}$ may have different phases, non-overlapping phases, or slightly overlapping phases. Any overlap in the phases of two clocks $V_{CLK1}$ and $V_{CLK2}$ is small enough to cause proper propagation of charge current without backward propagation of charge current.

During time t0, $V_{clk1}=1$ and $V_{clk2}=0$, $I_{SUPPLY}$ of MESO inputs cells 901, 902, and 903 is on while $I_{SUPPLY}$ of MESO output cell stage 905 is off. The ferroelectric 206b in MESO input cells 901, 902, and 903 has a transient current path from the input driver $V_{DD}$ to the ground, while the transient conduction path from MESO output cell 905 to conductor 211 is off. In this example, ferroelectric 206b of MESO input cells 901, 902, and 903 switch from –QF to +QF if –QF is on 206b (e.g. initial MESO state is State "0"), or stays at +QF if +QF is on 206b (e.g. initial MESO state is State "1"), due to positive current $I_{charge(IN)}$ along the x-axis. Note, depending on the direction of input charge current on conductors 211a, the ferroelectric 206b may switch differently. For example, ferroelectric 206b of MESO input cells 901, 902, and 903 switches from +QF to –QF if +QF is on 206b (e.g., initial MESO state is State "1"), or stays at –QF if –QF is on 206b (e.g. initial MESO state is State "0"), due to negative current $I_{charge(IN)}$ along the x-axis. The ferroelectric 206a of MESO output cell 905 may get charged according to the effective direction of current in conductor 904. However, since $V_{clk2}=0$, the output of MESO cell 905 is not determined yet.

During time t1 after t0, $V_{clk2}=0$ and $V_{clk1}=1$, a transient current path exists from $V_{dd}$ of MESO stage 905 to ground of MESO stage 905. This allows the MESO output cell 905 to provide the minority logic function output.

When phases of $V_{CLK1}$ and $V_{CLK2}$ overlap, MESO input cells 901, 902, and 903 drive MESO 905 and generates an input current to MESO 905 based on the summation of output currents on interconnect 904. The minority function is completed by MESO output cell 905, where its state follows the minority among states of MESO input cells 901, 902, and 903.

In the example of FIG. 10, at t0, if negative current $I_{charge}$(IN1) and $I_{charge}$(IN2) are for input cells 901 and 902, and positive current $I_{charge}$(IN3) is for input cell 903 at t0, states A and B of input MESO cell 901 and 902 are in State "0" (–Q), state C of input MESO cell 903 is in State "1" (+Q). When phases of $V_{CLK1}$ and $V_{CLK2}$ overlap, 901 and 902 generate positive output currents $I_{ch1}$ and $I_{ch2}$ along x-axis, 903 generates negative output currents LB. The summation of output currents on interconnect 904 $I_{charge}$ (IN4) equals to $(I_{ch1}+I_{ch2}+I_{ch3})$ which is the same as $I_{ch1}$ or $I_{ch2}$, assuming magnitude of $I_{ch3}$ equals to $I_{ch1}$ under asymmetrical drive strength assumption. This results in a positive input current $I_{charge(IN4)}$ to the input node 904 of the output MESO 905 and deposits positive charge +Q on 206a of 905, switching 905 to the same state as that of 903 (206b of 903 also has +Q). Note the switching to the "minority" state among 901, 902 and 903 (minority function) only occurs when phases of $V_{CLK1}$ and $V_{CLK2}$ overlap. After this "switching phase", the output current $I_{charge(OUT)}$ of MESO 905 can drive the next MESO stage.

While two clocks are shown for MESO device 1000, more than two clocks may be used. For example, each MESO input cell may operate on its own clock such that there is small overlap between the clocks of the MESO input cells.

Figure 11:
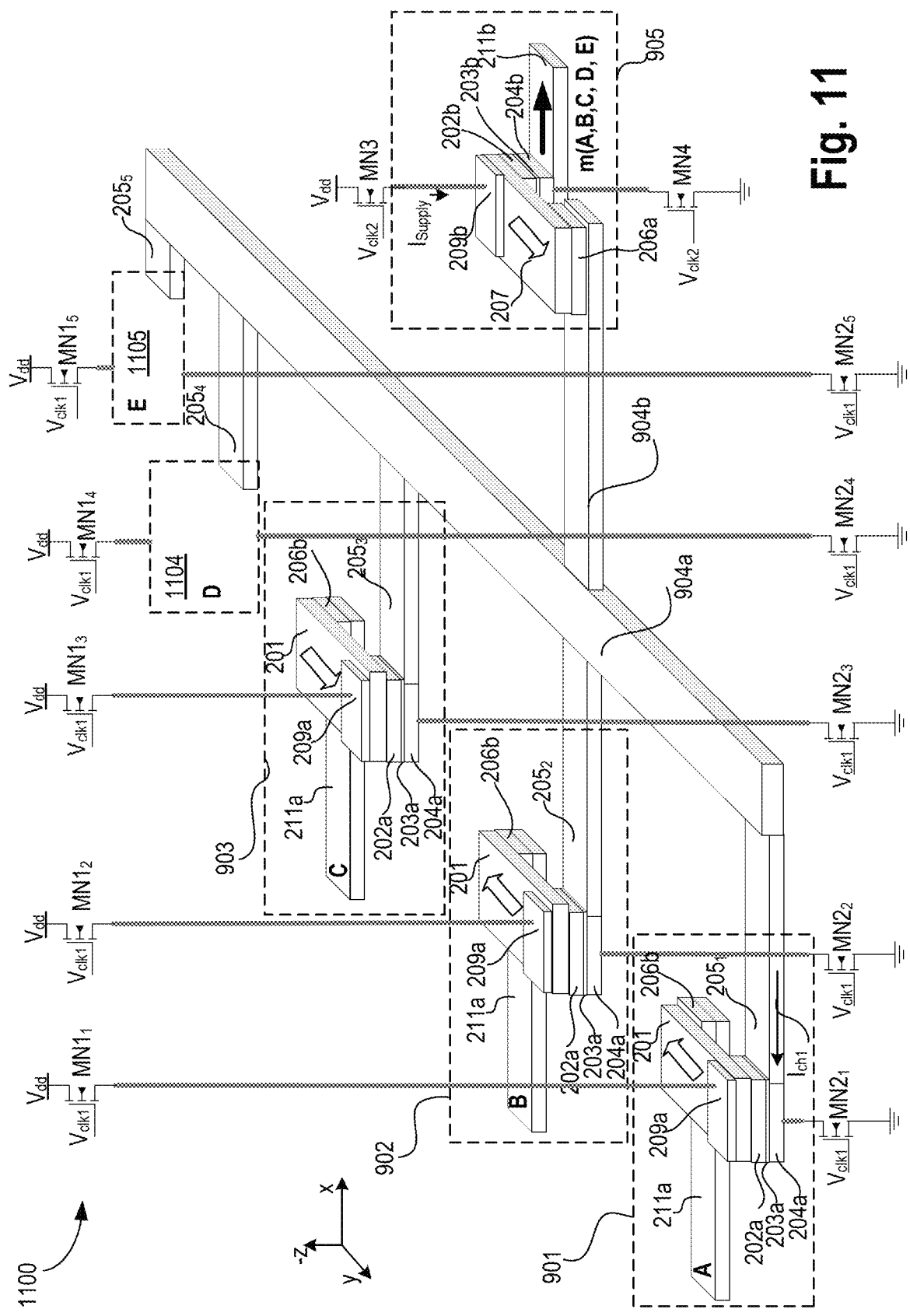
FIG. 11 illustrates a 5-input MESO minority gate device with two-phase clocking circuitry to control logic computation, in accordance with some embodiments.

FIG. 11 illustrates a 5-input MESO minority gate device 1100 with two-phase clocking circuitry to control logic computation, in accordance with some embodiments. Device 1100 is an extension of the idea of device 1000 with five MESO input cells 901, 902, 903, 1104, and 1105, and one MESO output cell 905. Any number of input MESO cells can be coupled to common interconnect 904a, which couples to the input conductor 904b of the output MESO cell 905. Here, the output conductors 205$_{1-5}$ are coupled to common interconnect 904a. While some MESO minority gate device figures do not show 904a and 904b as two separate conductors, the minority gate function can be performed with the 904 conductor directly coupled to the MESO output cell, in accordance with some embodiments.

Figure 12:
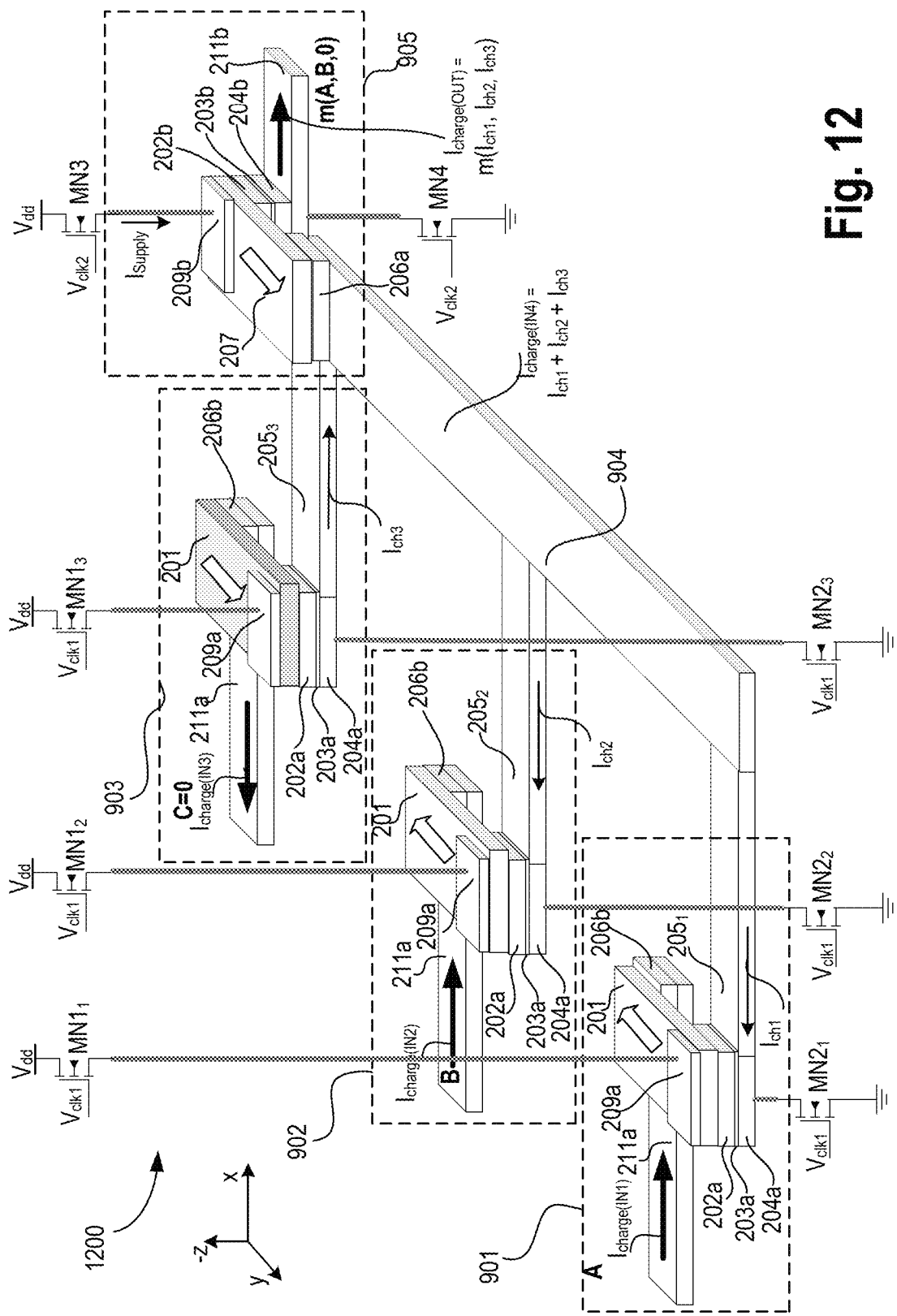
FIG. 12 illustrates a 2-input MESO NAND minority gate device with two-phase clocking circuitry to control logic computation, in accordance with some embodiments.

FIG. 12 illustrates a 2-input MESO NAND minority gate device 1200 with two-phase clocking circuitry to control logic computation, in accordance with some embodiments. Any complicated logic function can be synthesized with NAND logic gate 1200. Here, the 3-input MESO minority gate 1100 is used to form a MESO based 2-input logic "NAND" gate 1200 by applying one input node to be always "0". For example, MESO input device 903 with input C is always set to 0 by either providing a charge current $I_{charge}$ (IN3) which causes magnet 201 of device 903 to point along the +y-axis or by making magnet 201 a fixed magnet with magnetization along the +y-axis. The resulting minority logic output m(A,B,0) is that of a NAND logic of inputs A and B.

Figure 13:
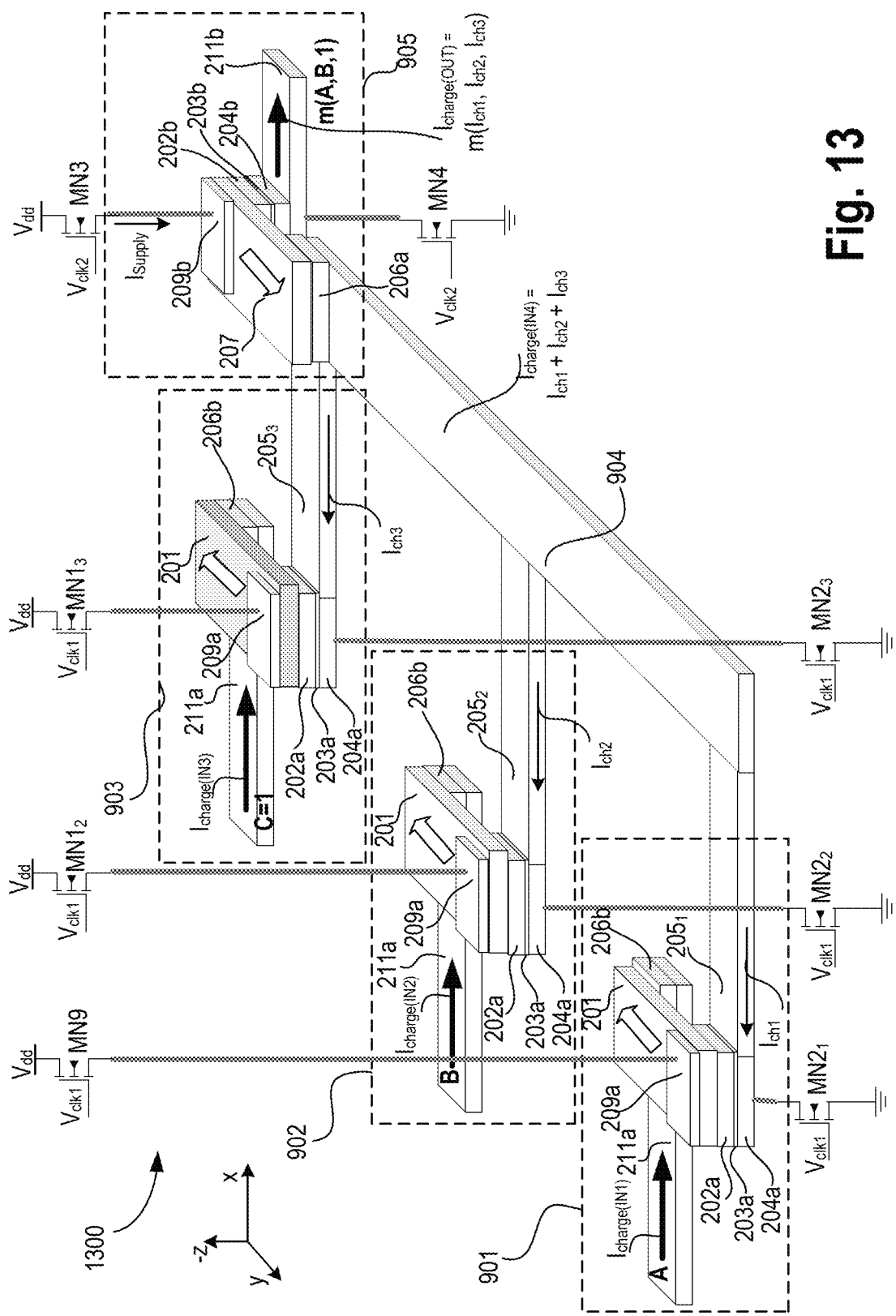
FIG. 13 illustrates a 2-input MESO NOR minority gate device with two-phase clocking circuitry to control logic computation, in accordance with some embodiments.

FIG. 13 illustrates a 3-input MESO NOR minority gate device 1300 with two-phase clocking circuitry to control logic computation, in accordance with some embodiments. Here, the 3-input MESO minority gate 1100 is used to form a MESO based 2-input logic "NOR" gate 1300 by applying one input node to always "1". For example, MESO input device 903 with input C is always set to 1 by either providing a charge current $I_{charge}$ (IN3) which causes magnet 201 of device 903 to point along the –y-axis or by making magnet 201 a fixed magnet with magnetization along the –y-axis.

Since MESO minority function is based on the current summation at each input node of the MESO device, the symmetrical output current magnitude for State "1" and State "0" in the MESO devices is used for minority function. Moreover, the MESO supply current determines the output current magnitude, the peripheral CMOS circuit to generate the supply current for MESO minority gate is used in MESO minority function.

As discussed with reference to FIGS. 7-8, MESO device itself with a single input is equivalent to an inverter (INV) or buffer depending on the polarity of the power supplies. Therefore, with the 3-input MESO minority gate design, the basic building logic (NAND, NOR, INV, and buffer) are obtained for synthesis of any arbitrarily logic functions, in accordance with various embodiments.

Figure 14:
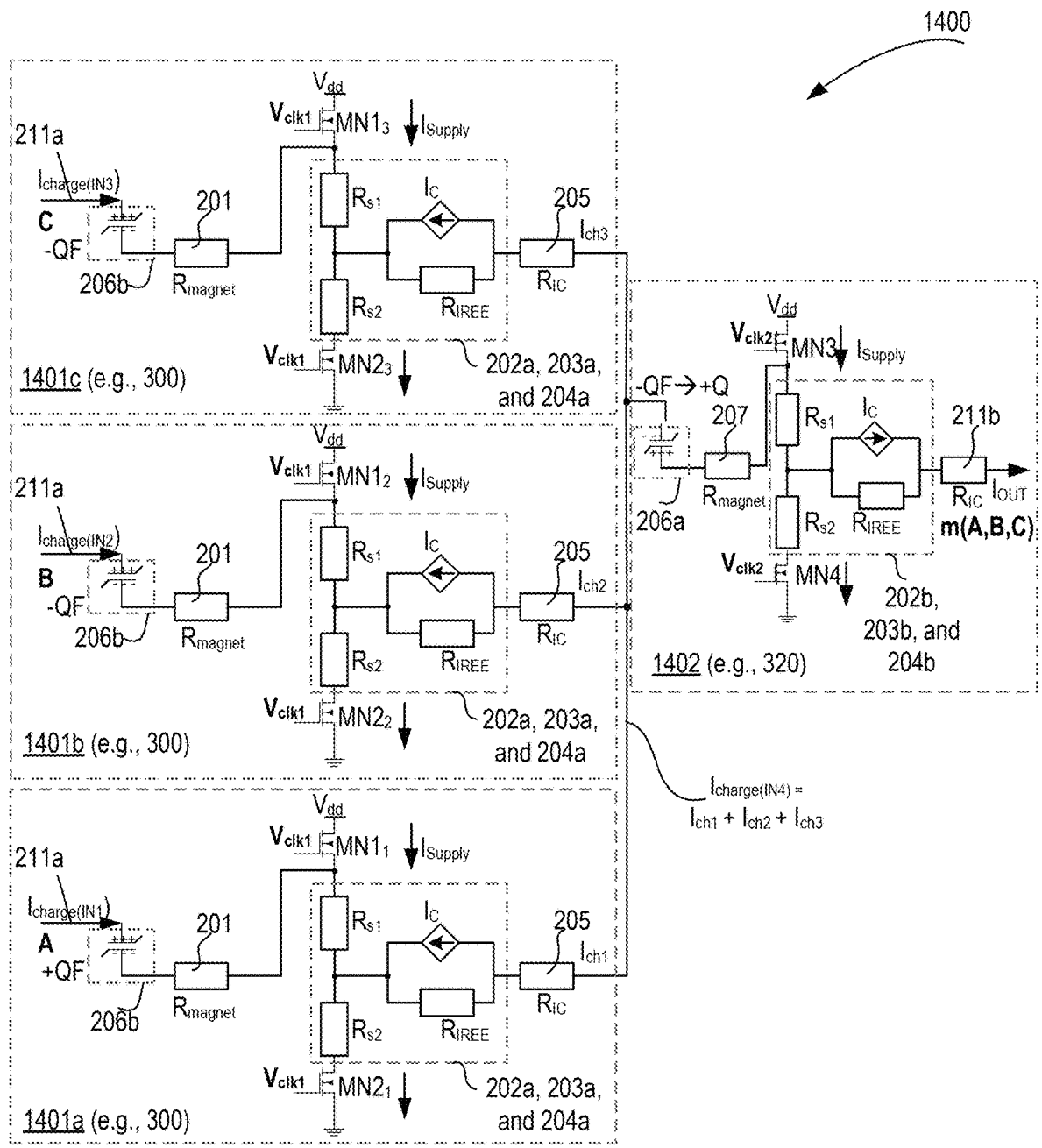
FIG. 14 illustrates an equivalent circuit of the 2-input MESO minority gate device of FIG. 10, in accordance with some embodiments.

FIG. 14 illustrates an equivalent circuit 1400 of the 3-input MESO minority gate device of FIG. 10, in accordance with some embodiments. To simulate MESO minority gate operation, a macro circuit model is used for the MESO device. The MESO device components are modeled with ferroelectric capacitor ($C_{FE}$) 206a/b, ferro-magnet ($R_{magnet}$) 201/207, inverse spin orbit coupling material stack (ISOC) as series connected resistances $R_{s1}$ and $R_{s2}$, 2D electron gas channel resistance as $R_{IREE}$, and interconnect resistance as $R_{IC}$.

The ME structure 206a/b converts the input charge current $I_{INPUT}$ (e.g., $I_{charge(IN1)}$, $I_{charge(IN2)}$, or $I_{charge(IN3)}$) to spin to switch the ferro-magnet, while the Spin orbit (SO) stack converts the spin current in ISOC stack (generated by the supply current and spin in the ferro-magnet) to output charge current $I_{OUTPUT}$ (e.g., $I_{ch1}$, $I_{ch2}$, or $I_{ch3}$) using inverse spin orbital coupling (ISOC) effect. A supply charge current is used for MESO, which can be implemented by a transistor connecting in series with the power supply $V_{dd}$ and the interface material layer to the ferro-magnet.

The ME is a ferroelectric capacitor $C_{FE}$ comprising of a metal plate, ferroelectric dielectric and a ferro-magnet. A hardware transfer language such as Verilog-A can be used to model the ferroelectric switching characteristics. The ferromagnet state represents the MESO state, where the state "1" and state "0" are corresponding to positive polarization charge (+Q) and negative polarization charge (−Q) stored on $C_{FE}$, respectively. The SO (converting spin current to output current) is a current controlled current source. For 100% conversion efficiency, the generated 2D electron gas $I_{ISOC}$ equals to current through the ISOC stack ($I_{RS1}$), and the direction of the current is determined by the ferro-magnet state (modelled by the normalized polarization state $QFE_{norm}$). If +Q is stored in $C_{FE}$ (state "1"), $I_{OUTPUT}$ is in the opposite direction compared to $I_{INPUT}$.

The simulation results use the following MESO parameters: $R_{s1}=R_{s2}=100$ Ohm, $R_{FM}=R_{IC}=1$ kOhm, $R_{ISOC}=5$ k Ohm, $C_{FE}$ is 320 aC polarization charge with $V_{dd}=150$ mV, 2 fins for both NMOS devices, $V_{CLK1}$ and $V_{CLK2}$ are at 1V. Note that MESO energy scales linearly with ferroelectric charge. At 32 aC polarization charge, $V_{dd}=100$ mV, the switching of a single stage MESO device is 10 aJ. The path to 1 aJ/bit is feasible with 1 uC/cm$^2$ ferroelectrics operating at 100 mV supply voltage.

The header and footer NMOS transistors ($MN1_{1-3}$, MN3, and $MN2_{1-3}$, MN4) at each MESO device are applied to synchronize the switching operation and provide the supply current. Since MESO devices are in the interconnect metal layer of a die, the peripheral CMOS transistors are in the device layer that connect to MESO through metal vias. For example, MESO devices can be formed in the backend while the transistors can be formed in the frontend of the die.

For input stages 1401a (e.g., 901), 1401b (e.g., 902), and 1401c (e.g., 903) with inputs A, B and C, respectively, the gate terminals of the header ($MN1_{1-3}$) and footer ($MN2_{1-3}$) NMOS transistors are connected to control signal $V_{CLK1}$. The header (MN3) and footer (MN4) NMOS transistors minority output gate MESO 1402 (e.g., 905) have their gate terminals connecting to $V_{CLK2}$.

Similar as the cascaded MESO design of FIG. 5, in some embodiments, $V_{CLK1}$ and $V_{CLK2}$ are clock signals, having ⅓ of their high clock phase overlapping with each other. In other embodiments, other overlapping durations may be used. During the overlapping period, the outputs $I_{OUT1}$, $I_{OUT2}$, and $I_{OUT3}$ of first MESO stage (e.g., 1401a (e.g., 901 or 300), 1401b (e.g., 902 or 300), and 1401c (e.g., 903 or 300)) MESO cells drives the second stage MESO device 1402 (e.g., 905 or 320). The output stage MESO device 1402 (e.g., 905, 320) is also referred to as MESO O. The overlapped clock signal design reduces the back propagation issue in traditional cascaded MESO circuits and ensures the stage synchronization in minority gate operation. Note that here the 3-input minority gate uses one MESO device as its output device.

FIGS. 15A-B illustrate plots 1500, 1501, 1502, 1520, 1521, and 1522 showing simulations of MESO minority gate device of FIG. 14 having ideal current sources, in accordance with some embodiments. Here, an ideal current source is used to ensure near symmetrical current drive strength for State "1" and State "0". The plots show the $V_{CLK1}$ and $V_{CLK2}$ control signals, MESO A (1401a), B (1401b) and C (1401c) output current, MESO O (1402) input current as well as the state change of MESO device O for two different cases, namely, (1) O=m(1,1,0) (A=B="1" or +Q, C="0" or −Q) and, (2) O=m(0, 0, 1) (A=B="0" or −Q, C="1" or +Q), respectively. When $V_{CLK1}$ and $V_{CLK2}$ overlap, MESO A, B and C drives MESO O and generates an input current to MESO O based on the summation of their output current. The minority function is completed by MESO O, where its state follows the minority among A, B and C.

FIGS. 16-23 illustrate different variations of MESO minority gate designs with different peripheral CMOS circuit techniques to generate symmetrical or asymmetrical output current for different MESO states, in accordance with some embodiments.

Figure 16:
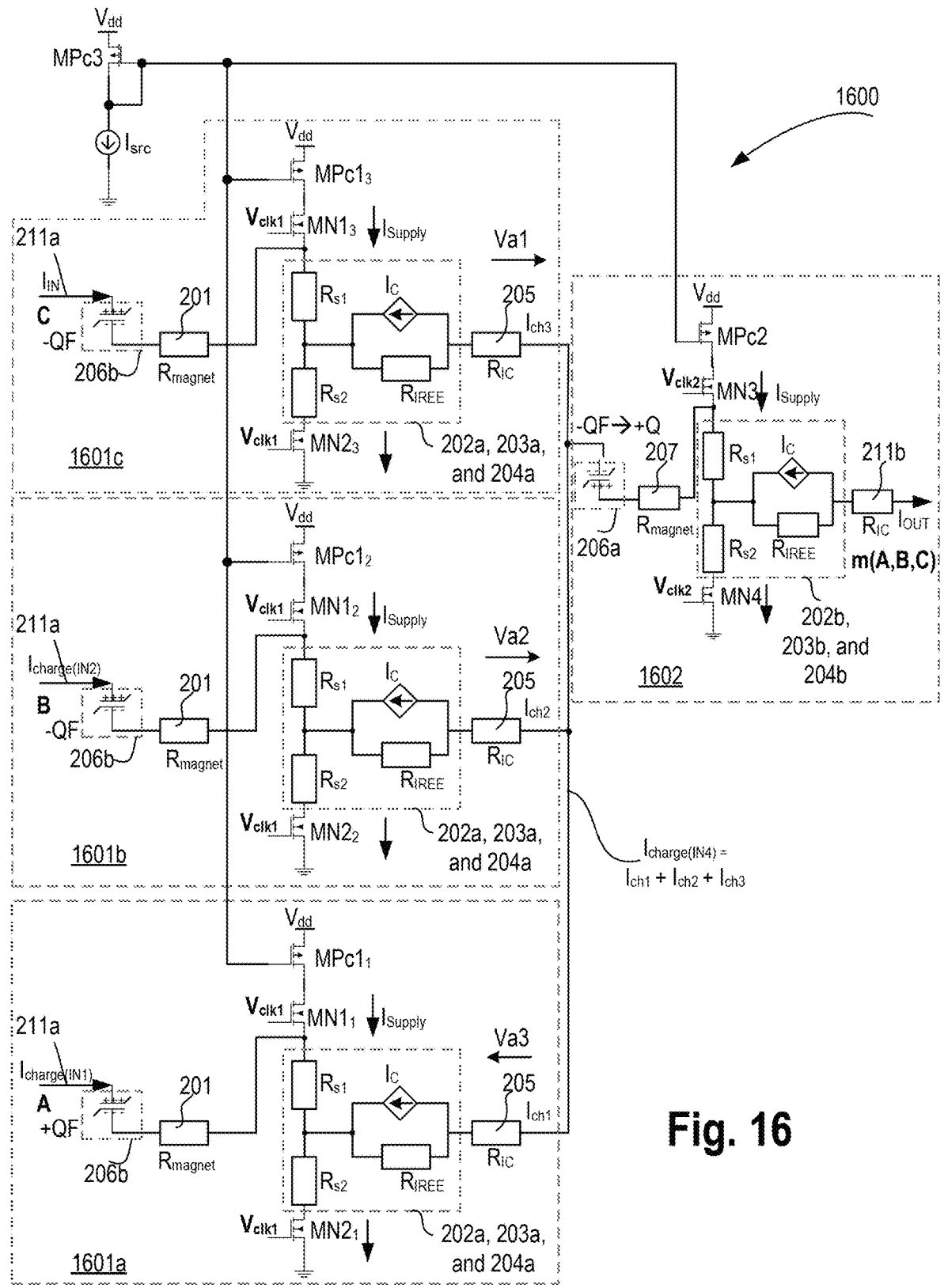
FIG. 16 illustrates an equivalent circuit of the 3-input MESO minority gate device having current mirrors, in accordance with some embodiments.

FIG. 16 illustrates an equivalent circuit 1600 of the 3-input MESO minority gate device (e.g., FIG. 10) having current mirrors, in accordance with some embodiments. In some embodiments, symmetrical inputs (e.g., input to MESO 1602) and symmetrical output (e.g., output of MESO 1602) is achieved by using current mirrors. Each input MESO cell has a current mirror device stacked over the header transistor. For example, for MESO input cell 1601a (e.g., 901), a p-type transistor $MPc1_1$ is coupled in series to header device $MN1_1$ and biased by a diode-connected p-type transistor MPc3. This diode-connected p-type transistor MPc3 is coupled to a current source $I_{src}$. The p-type device $MPc1_1$ mirrors the current through transistor MPc3. For MESO input cell 1601b (e.g., 902), a p-type transistor MPc12 is coupled in series to header device MN12 and biased by the diode-connected p-type transistor MPc3. The p-type device MPc12 mirrors the current through transistor MPc3. For MESO input cell 1601c (e.g., 903), a p-type transistor MPc13 is coupled in series to header device MN13 and biased by the diode-connected p-type transistor MPc3. The p-type device MPc13 mirrors the current through transistor MPc3. For MESO output cell 1602 (e.g., 905), a p-type transistor MPc2 is coupled in series to header device MN3 and biased by the diode-connected p-type transistor MPc3. The p-type device MPc2 mirrors the current through transistor MPc3. In this example, the supply voltage is 300 mV.

The usage of the current mirror (1600) ensures consistent drive current $I_{drive}$ through every MESO device regardless of the states. For example, when $V_{CLK1}$ is ON, MESO cells 1601c, 1601b and 1601a have the same bias current as $I_{src}$. This allows for correct minority function since MESO minority gate logic function relies on current summation. Note, the output voltage at the node which connects MESO cells 1601c, 1601b and 1601a to 201a of 1402 depends on the states of input MESO cells (e.g., different between m(1,1,0) and m(0,0,1)). Without the current mirror or other techniques to stabilize the drive current when coupling the outputs of several MESO devices together, the coupling of the outputs of several MESO devices together can disturb the drive current through back propagation.

For example, assuming different MESO states of 1601a, 1601b and 1601c at their respective input magnets 201, output voltages at respective conductors 205 are different for MESO cells 1601a, 1601b and 1601c since the respective output currents (e.g., $I_{ch1}$, $I_{ch2}$ and $I_{ch3}$) have different directions. This voltage difference between the output voltages at respective conductors 205 for MESO cells 1601a, 1601b and 1601c are for different combination of MESO input magnet states that create different backpropagation current through $R_{IREE}$ for State "1" and State "0", which can strengthen the "minority" input MESO devices and weaken the "majority" input MESO devices. The consistent current bias mitigates the backpropagation disturbance regardless of the states of MESO devices and ensures symmetrical output current $I_{ch1}$, $I_{ch2}$ and $I_{ch3}$ generated at respective conductors 205 for both State "0" and State "1" according to the equation for $I_c$ (e.g., $I_c = K*I_{drive}$). In addition, the same current bias for the output MESO stage ensures the cascadability to the following MESO stages (e.g., regeneration of the current output of the same magnitude at 211b).

Figure 17A:
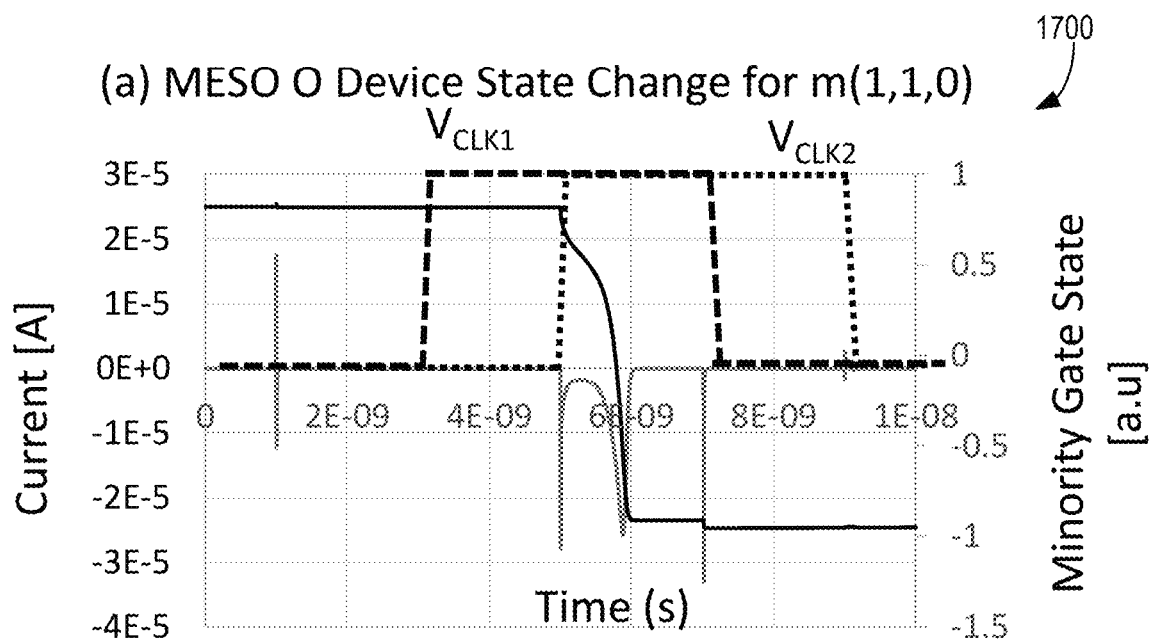
FIGS. 17A-B illustrate plots showing simulations of MESO minority gate device of FIG. 16 having ideal current sources, in accordance with some embodiments.
Figure 17B:
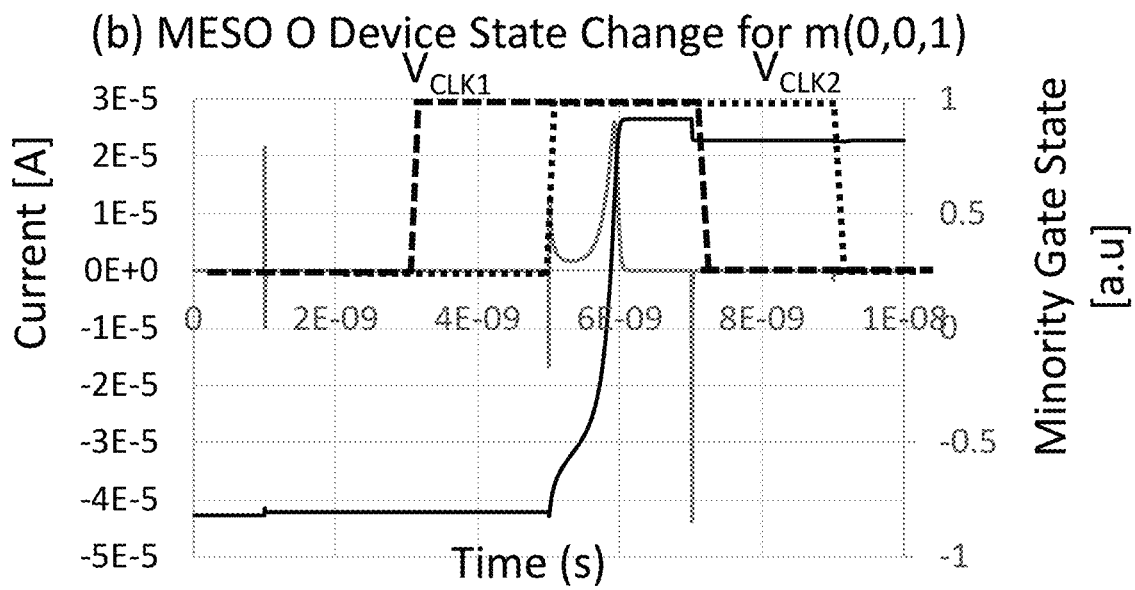

FIGS. 17A-B illustrate plots 1700 and 1720, respectively, showing simulations of MESO minority gate device of FIG. 16 having current mirrors, in accordance with some embodiments. Plots 1700 and 1720 show the change in states for the output MESO cell 1602 (e.g., 905) from "1" to "0" (in plot 1700) and the change in states from "0" to "1" (in plot 1720) to be symmetrical due to the current mirror architecture. For example, the switching speed from one state to another is symmetrical.

Figure 18:
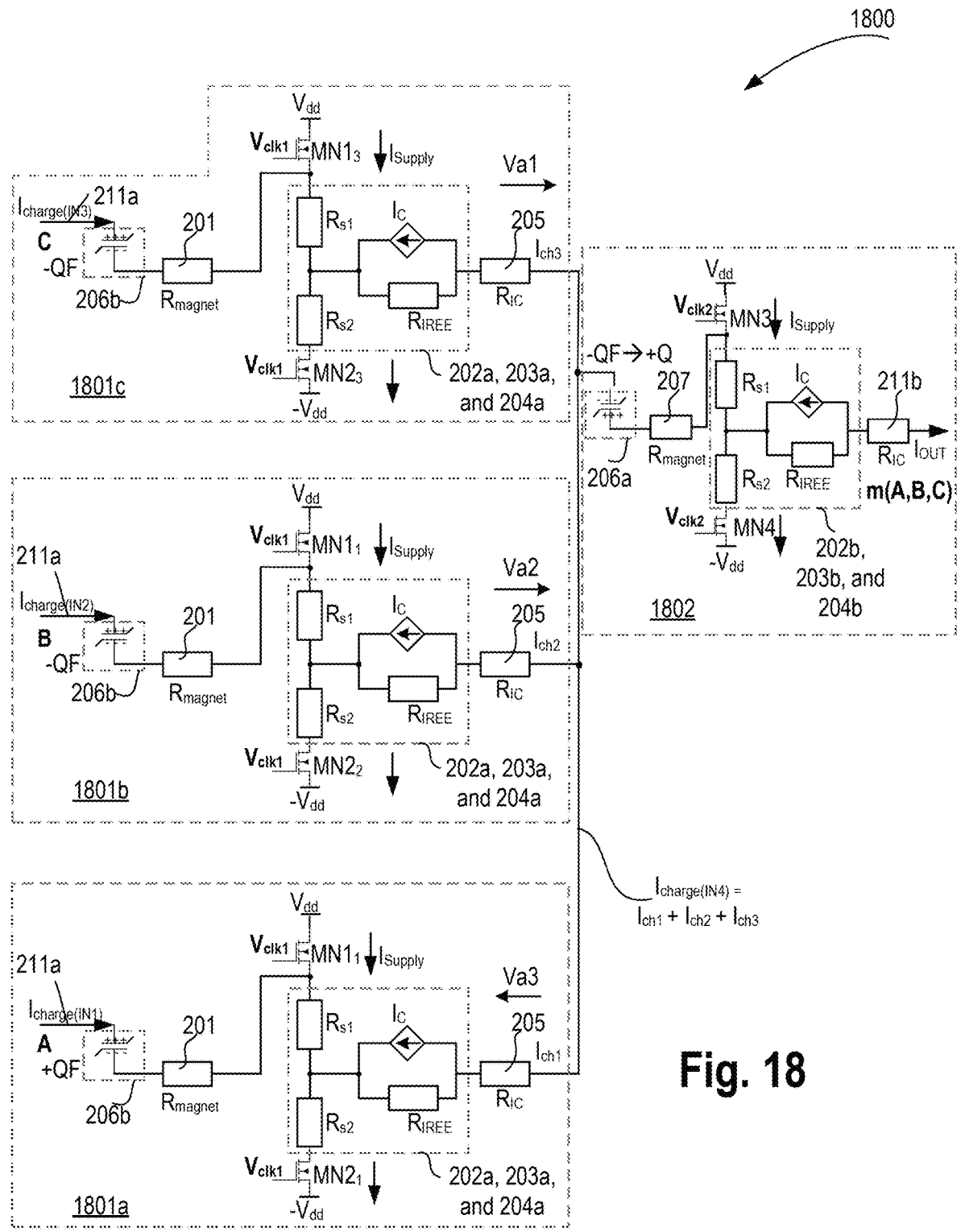
FIG. 18 illustrates an equivalent circuit of the 3-input MESO minority gate device having dual supply rails, in accordance with some embodiments.

FIG. 18 illustrates an equivalent circuit 1800 of the 3-input MESO minority gate device having dual supply rails, in accordance with some embodiments. Here, dual supply rails, $V_{dd}$ and $-V_{dd}$, are used for header and footer devices, respectively for MESO cells 1801a (e.g., 901), 1801b (e.g., 902), 1801c (e.g., 903), and 1802 (e.g., 905). By having dual supply rails, the switching speed for one case becomes faster than the other. In this example, the switching speed of change in state from output MESO cell state "0" to state "1" is faster than the switching speed of change in output MESO cell state from state "1" to state "0". The supply voltages are lowered to 150 mV and −150 mV compared to the supply voltage of circuit 1700. In this example, the clocks toggle between 850 mV and −150 mV.

Figure 19A:
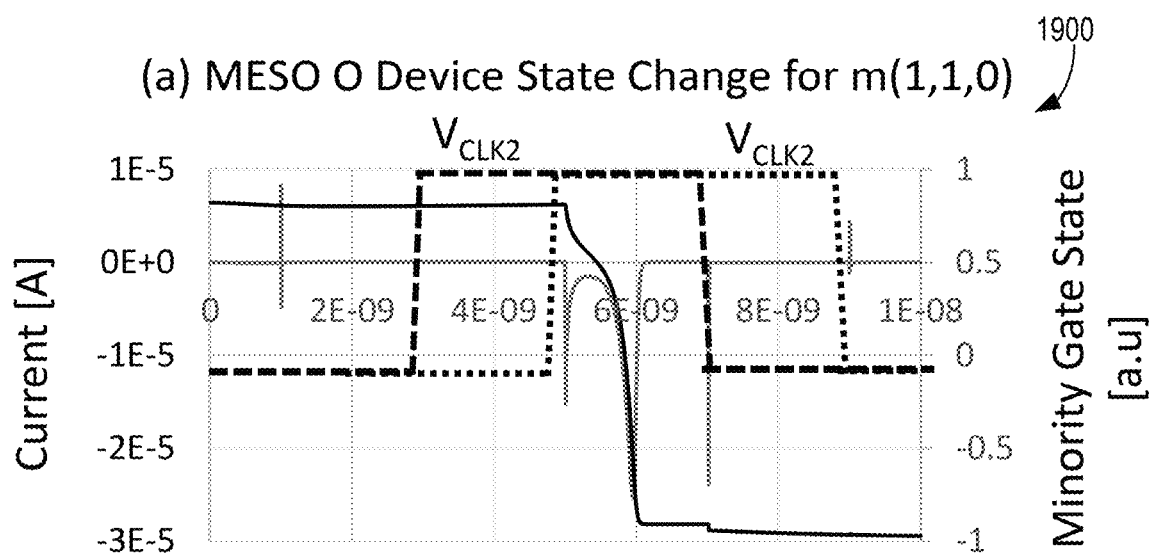
FIGS. 19A-B illustrate plots showing simulations of MESO minority gate device of FIG. 18 having dual supply rails, in accordance with some embodiments.
Figure 19B:
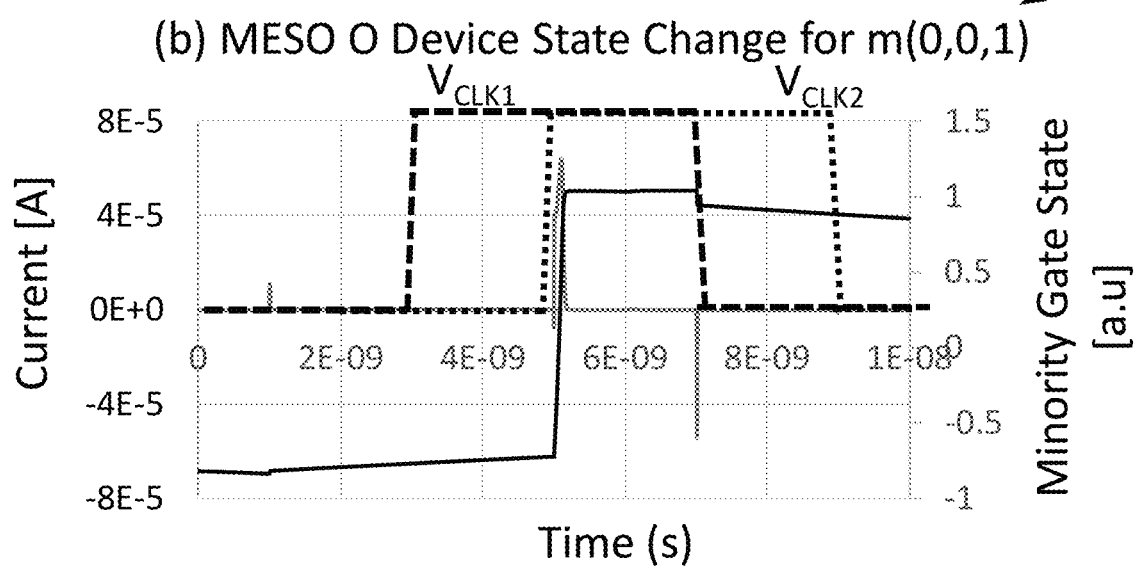

FIGS. 19A-B illustrate plots 1900 and 1920, respectively, showing simulations of MESO minority gate device of FIG. 18 having dual supply rails, in accordance with some embodiments. The dual supply rails ensure the output voltage is nearly to 0V. As such, the dual supply rails minimize the backpropagation induced drive current disturbance.

Figure 20:
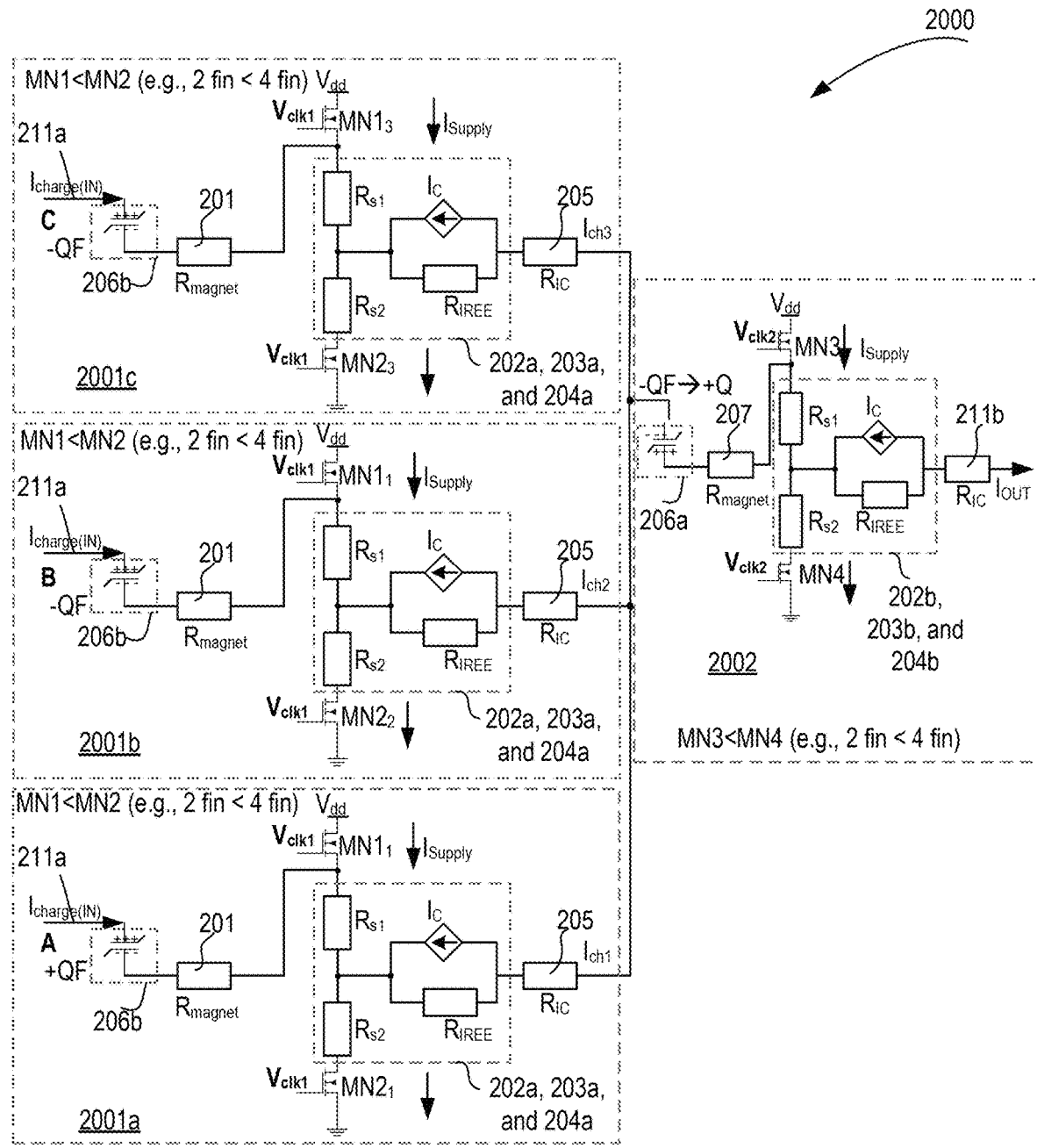
FIG. 20 illustrates an equivalent circuit of the 3-input MESO minority gate device having asymmetrical transistor sizing, in accordance with some embodiments.

FIG. 20 illustrates an equivalent circuit 2000 of the 3-input MESO minority gate device having asymmetrical transistor sizing, in accordance with some embodiments. In some embodiments, the footer devices are made stronger or larger in size compared to the header devices for the MESO cells 2001a (e.g., 901), 2001b (e.g., 902), 2001c (e.g., 903), and 2002 (e.g., 905). For example, when the devices are FinFET devices, the footer devices may have 4 fins while the header devices may have 2 fins. The asymmetry in the sizing of the header and footer transistors results in the switching speeds of the change in states of the output MESO cell to be symmetrical and reduces the asymmetrical output induced drive current disturbance. The supply voltage is lowered to 200 mV compared to the supply voltage of circuit 1700. As such, circuit 2000 consumes less power than circuit 1700.

Figure 21A:
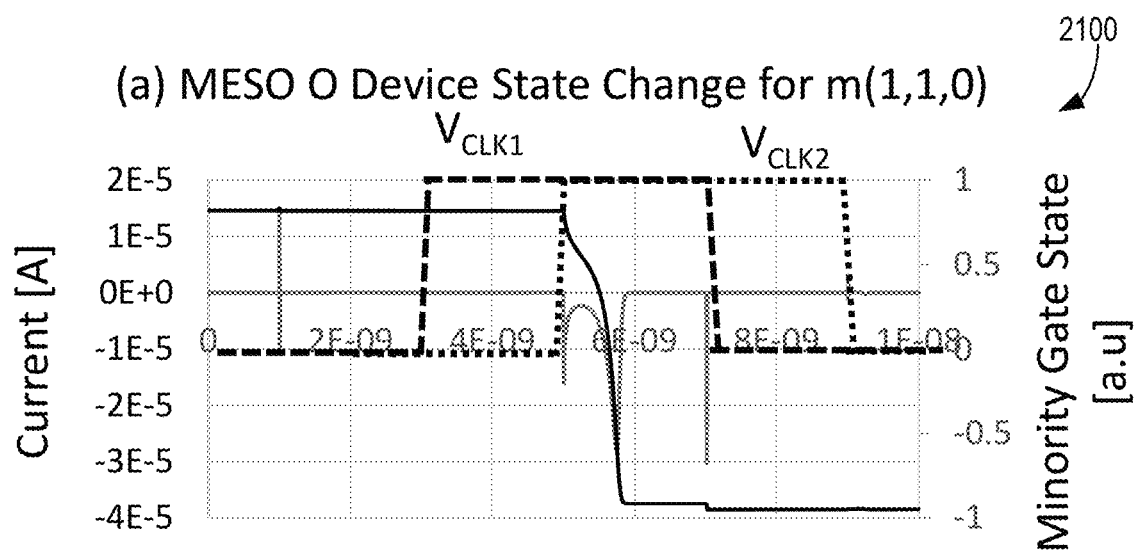
FIGS. 21A-B illustrate plots showing simulations of MESO minority gate device of FIG. 20 having asymmetrical transistor sizing, in accordance with some embodiments.
Figure 21B:
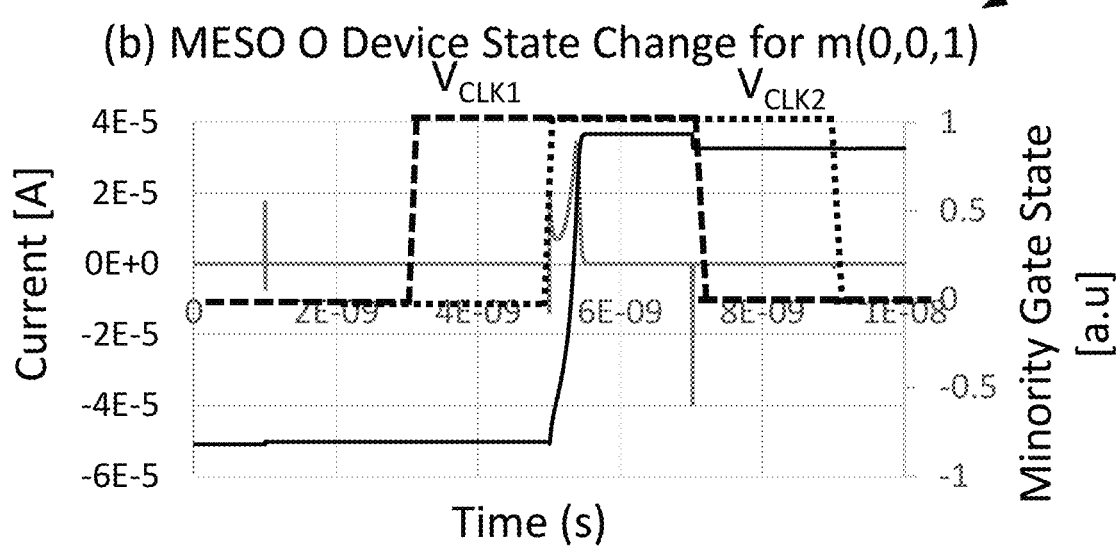

FIGS. 21A-B illustrate plots 2100 and 2120, respectively, showing simulations of MESO minority gate device of FIG. 20 having asymmetrical transistor sizing, in accordance with some embodiments.

Figure 22:
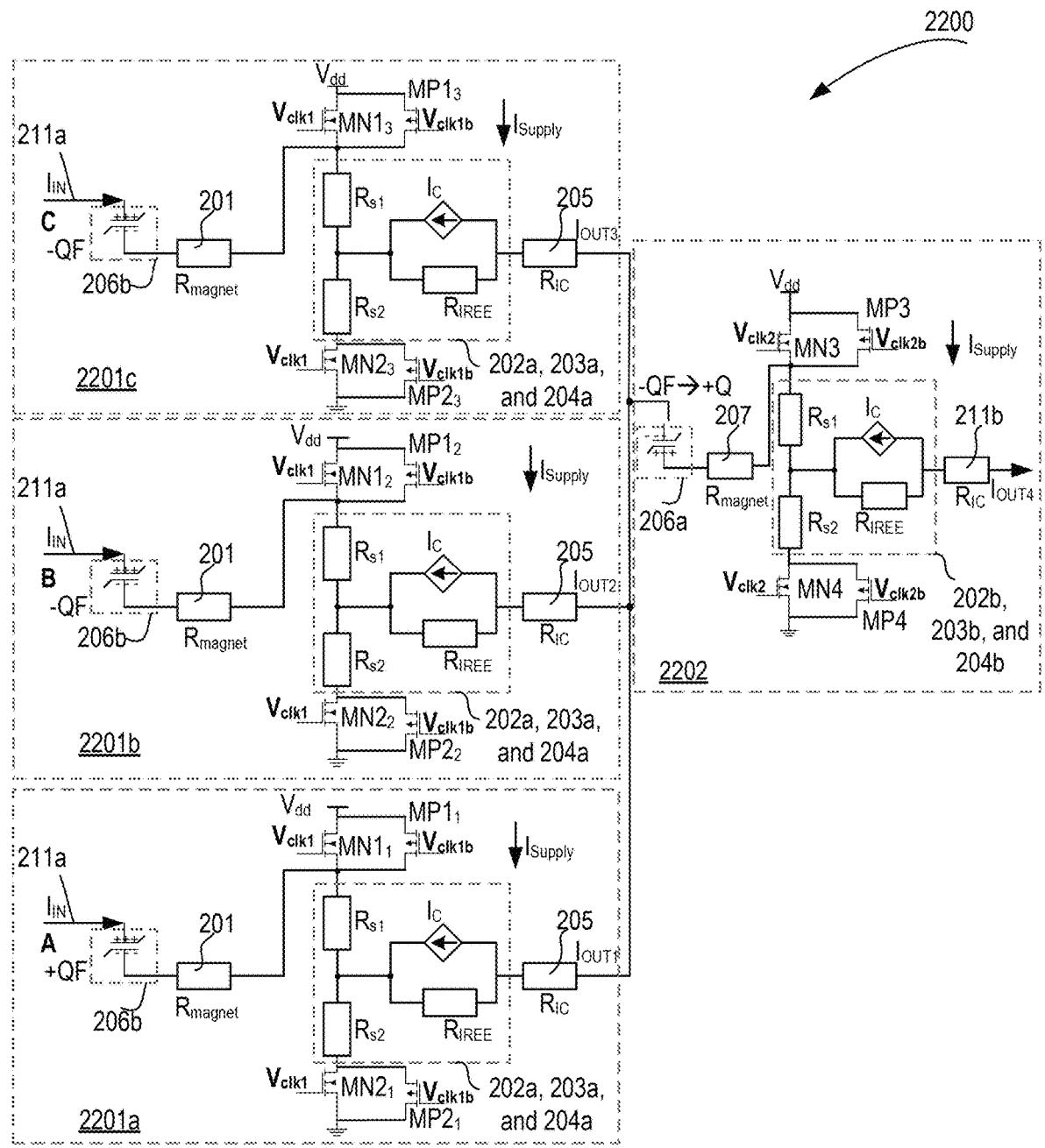
FIG. 22 illustrates an equivalent circuit of the 3-input MESO minority gate device having clock controlled transmission gates, in accordance with some embodiments.

FIG. 22 illustrates an equivalent circuit 2200 of the 3-input MESO minority gate device having clock controlled transmission gates, in accordance with some embodiments. Compared to circuit 1700, here the header and footer devices comprise transmission gates. For example, for MESO cell 2201a (e.g., 901), the header comprises $MN1_1$ and $MP1_1$, and footer comprises $MN2_1$ and $MP2_1$. For MESO cell 2201b (e.g., 902), the header comprises MN12 and MP12, and footer comprises MN22 and MP22. For MESO cell 2201c (e.g., 903), the header comprises MN13 and MP13, and footer comprises MN23 and MP23. For MESO cell 2202 (e.g., 905), the header comprises MN3 and MP3, and footer comprises MN4 and MP4. Transmission gate design allows minimum transistor sizing (e.g., at 200 mV supply voltages) compared to current mirror design in apparatus 1700 and asymmetrical transistor sizing based design in apparatus 2000. The transmission gates in the footer and header devices can increase the switching speed of one side. In this example, the switching speed from change in state from "0" to "1" is faster than the switching speed from change in stage from "1" to "0".

Figure 23A:
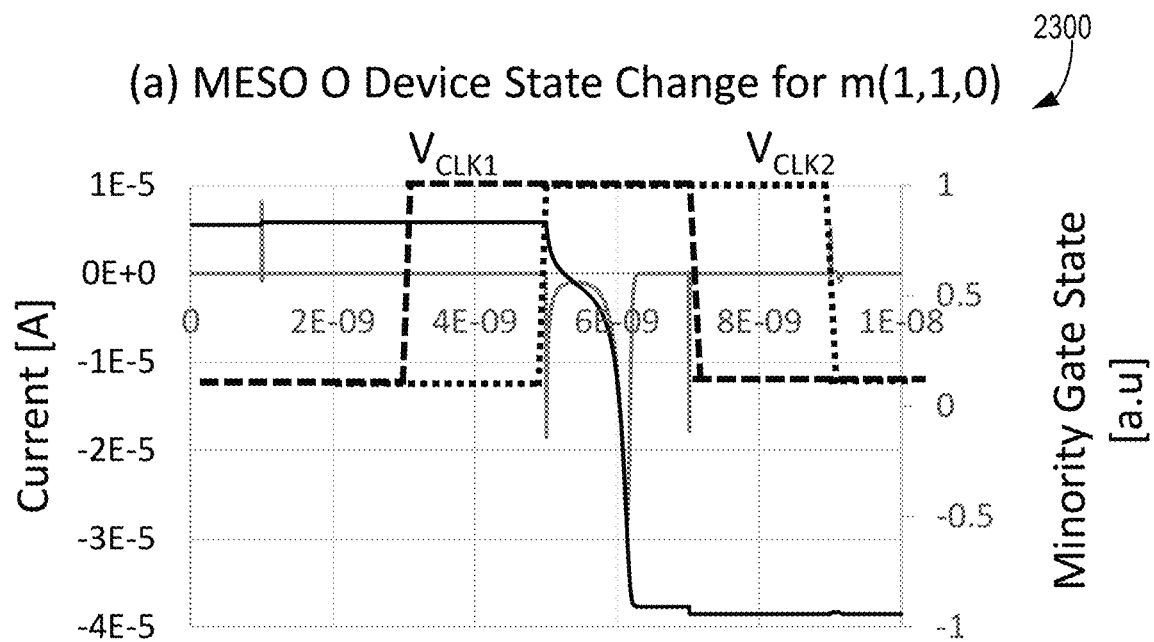
FIGS. 23A-B illustrate plots showing simulations of MESO minority gate device of FIG. 22 having clock controlled transmission gates, in accordance with some embodiments.
Figure 23B:
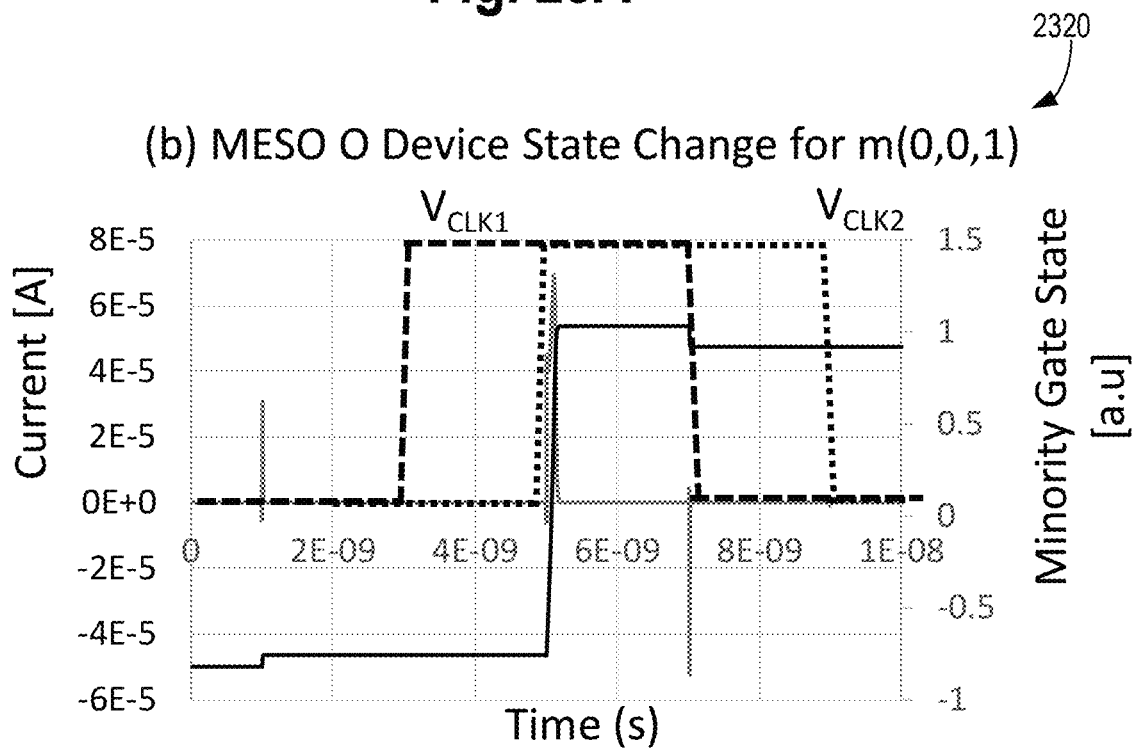

FIGS. 23A-B illustrate plots 2300 and 2320, respectively, showing simulations of MESO minority gate device of FIG. 22 having transmission gates, in accordance with some embodiments.

Figure 24:
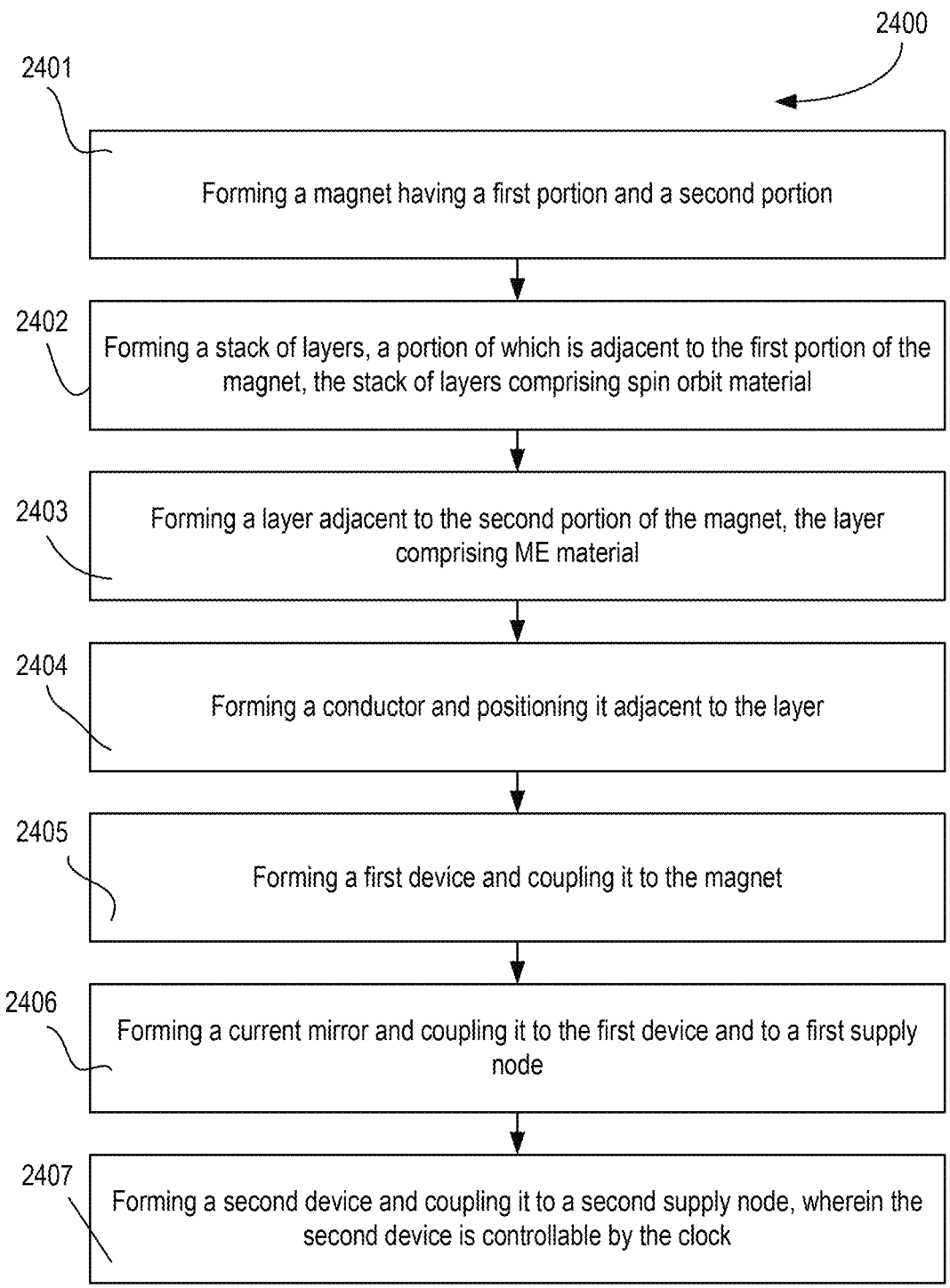
FIG. 24 illustrates a method flowchart for forming a MESO minority gate device of FIG. 16, in accordance with some embodiments.

FIG. 24 illustrates a method flowchart 2400 for forming a MESO minority gate device of FIG. 16, in accordance with some embodiments. The various blocks here can be performed in any suitable order. Some blocks can be performed in parallel to others while other blocks can be performed in a certain order.

At block 2401, a magnet 201 is formed having a first portion and a second portion. At block 2402, a stack of layers (202a, 203a, and 204a) are formed. A portion (e.g., 204a) of the stack of layers is adjacent to the first portion of the magnet 201, wherein the stack of layers comprises spin orbit material. At block 2403, layer 206b is formed adjacent to the second portion of magnet 201. The layer 206b comprises ME material. At block 2404 a conductor is fabricated and is adjacent to the layer. At block 2405, a first device (e.g., header MN1) is formed which is coupled to the magnet 201. The first device is controllable by a clock $V_{CLK1}$. At block 2406, a current mirror (e.g., $MPc1_1$) is formed which is coupled to the first device. At block 2407, a second device (e.g., MN2) coupled to a second supply node (e.g., Vss or ground) and to a layer (e.g., 204a) of the stack of layers, wherein the second device is controllable by the clock. Blocks 2401 through 2407 illustrate forming of a first MESO input cell.

In some embodiments, the method comprises forming an output MESO device, which comprises a second magnet 207 having a first portion and a second portion. In some embodiments, the method comprises forming a second stack of layers (202b, 203b, and 204b), a portion (e.g., 204b) of which is adjacent to the first portion of the second magnet, wherein the second stack of layers comprises spin orbit material. In some embodiments, the method comprises forming a second layer (e.g., 206a) adjacent to the second portion of the second magnet, the second layer comprising a magnetoelectric material. In some embodiments, the method comprises forming a second conductor (e.g., 205)

adjacent to the second layer and to a portion (e.g., 202a) of the first stack of layers. In some embodiments, the method comprises forming a third conductor (e.g., 211) adjacent to a portion (e.g., 202b) of the second stack of layers. In some embodiments, the method comprises forming a third device (e.g., MN3) coupled to the second magnet (207), wherein the third device is controllable by a second clock ($V_{CLK2}$). In some embodiments, the method comprises forming a second current mirror MPc2 coupled to the third device and to the first supply node ($V_{dd}$). In some embodiments, the method comprises forming a fourth device MN4 coupled to the second supply node (ground) and to a layer (e.g., 202b) of the second stack of layers, wherein the third device is controllable by the second clock ($V_{CLK2}$).

At least two more MESO input cells are fabricated (e.g., blocks 2401 through 2407) and then coupled to the MESO output cell. Each MESO input cell receives a separate input, wherein the MESO output cell performs a minority function on the inputs received by the MESO input cells.

In some embodiments, the first clock ($V_{clk1}$) has a first phase, wherein the second clock ($V_{clk1}$) has a second phase, and wherein the first phase is different from the second phase. For example, the first phase overlaps the second phase of ⅓. In some embodiments, the first, second, third, and fourth devices have the same conductivity type (e.g., n-type conductivity). In some embodiments, the first and third devices have a first conductivity type (e.g., p-type conductivity), and wherein the second and fourth devices have a second conductivity type (e.g., n-type conductivity). In some embodiments, the first layer and the second layer include one or more of: Cr, O, or multiferroic material. In some embodiments, the multiferroic material includes one of: $BiFeO_3$, $LuFeO_2$, $LuFe_2O_4$, or La doped $BiFeO_3$, or wherein the multiferroic material includes one of: Bi, Fe, O, Lu, or La. In some embodiments, the first stack of layers and the second stack of layers comprise a material which includes one or more of: β-Ta, β-W, W, Pt, Cu doped with Iridium, Cu doped with Bismuth, or Cu doped an element of 3d, 4d, 5d, 4f, or 5f of periodic table groups. In some embodiments, the first and second magnets comprise a paramagnet or a ferromagnet, or wherein the first and second magnets comprises a material which includes one or more of: Pt, Pd, W, Ce, Al, Li, Mg, Na, Cr, O, Co, Dy, Er, Eu, Gd, Fe, Nd, K, Pr, Sm, Tb, Tm, or V. In some embodiments, the first and second magnets comprise one or a combination of materials which includes one or more of: a Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, V, Ru.

Figure 25:
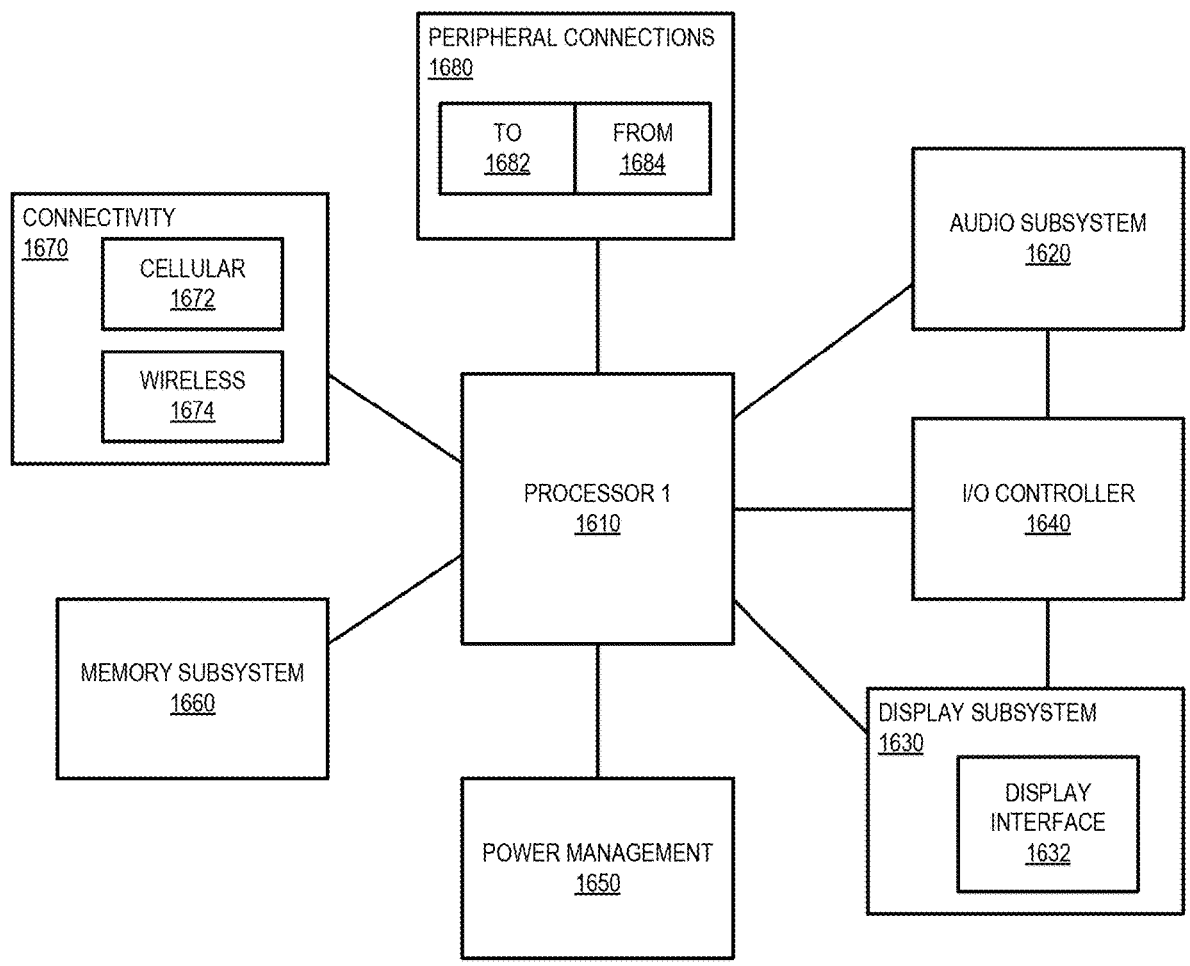
FIG. 25 illustrates a smart device or a computer system or an SoC (System-on-Chip) with MESO minority gate device, according to some embodiments.

FIG. 25 illustrates a smart device or a computer system or a SoC (System-on-Chip) with MESO minority gate device, according to some embodiments. FIG. 25 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with MESO minority gate device, according to some embodiments discussed. Other blocks of the computing device 1600 may also include a MESO minority gate device, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a magnet layer having a first portion and a second portion;
    a stack of layers, a portion of which is on the first portion of the magnet layer, wherein the stack of layers comprises spin orbit material;
    a layer on the second portion of the magnet layer, the layer comprising a magnetoelectric material;
    a conductor coupled to the layer;
    a first device coupled to the magnet, wherein the first device is controllable by a clock;
    a current mirror coupled to the first device and to a first supply node; and
    a second device coupled to a second supply node and to the stack of layers, wherein the second device is controllable by the clock.

2. The apparatus of claim 1, further comprising:
    a second magnet layer having a first portion and a second portion;
    a second stack of layers, a portion of which is adjacent to the first portion of the second magnet layer, wherein the second stack of layers comprises spin orbit material;
    a second layer adjacent to the second portion of the second magnet layer, the second layer comprising a magnetoelectric material;
    a second conductor adjacent to the second layer and to the portion of the stack of layers;
    a third conductor adjacent to a portion of the second stack of layers;
    a third device coupled to the second magnet, wherein the third device is controllable by a second clock;
    a second current mirror coupled to the third device and to the first supply node; and
    a fourth device coupled to the second supply node and to the second stack of layers, wherein the third device is controllable by the second clock.

3. The apparatus of claim 2, wherein the first clock has a first phase, wherein the second clock has a second phase, and wherein the first phase is different from the second phase.

4. The apparatus of claim 2, wherein the first, second, third, and fourth devices have a same conductivity type.

5. The apparatus of claim 2, wherein the first and third devices have a first conductivity type, and wherein the second and fourth devices have a second conductivity type.

6. The apparatus of claim 2, wherein the first layer and the second layer comprise one or more of Cr, O, or multiferroic material.

7. The apparatus of claim 6, wherein the multiferroic material comprises one of $BiFeO_3$, $LuFeO_2$, $LuFe_2O_4$, or La doped $BiFeO_3$, or wherein the multiferroic material comprises one of Bi, Fe, O, Lu, or La.

8. The apparatus of claim 6, wherein the first stack of layers and the second stack of layers comprise a material which comprises one or more of: β-Ta, β-W, W, Pt, Cu doped with Iridium, Cu doped with Bismuth, or Cu doped with an element of 3d, 4d, 5d, 4f, or 5f periodic table groups.

9. The apparatus of claim 2, wherein the first and second magnets comprise a paramagnet or a ferromagnet, or wherein the first and second magnets comprises a material which comprises one or more of Pt, Pd, W, Ce, Al, Li, Mg, Na, Cr, O, Co, Dy, Er, Eu, Gd, Fe, Nd, K, Pr, Sm, Tb, Tm, or V.

10. The apparatus of claim 2, wherein the first and second magnets comprise one or a combination of materials which comprises one or more of a Heusler alloy, Co, Fe, Ni, Gd, B, Ge, Ga, permalloy, or Yttrium Iron Garnet (YIG), and wherein the Heusler alloy is a material which comprises one or more of Cu, Mn, Al, In, Sn, Ni, Sb, Ga, Co, Fe, Si, Pd, Sb, V, or Ru.

11. An apparatus comprising:
    a first logic device comprising a spin orbit material, a magnetoelectric material, at least two transistors to operate using a first clock, and a current mirror coupled to one of the at least two transistors;
    a second logic device comprising a spin orbit coupling material, a magnetoelectric material, at least two transistors to operate using the first clock, and a current mirror coupled to one of the at least two transistors;
    a third logic device comprising a spin orbit coupling material, a magnetoelectric material, at least two transistors to operate using the first clock, and a current mirror coupled to one of the at least two transistors; and
    a fourth logic device coupled to the first, second and third logic devices, the fourth logic device comprising a spin orbit coupling material, a magnetoelectric material, at least two transistors to operate using a second clock, and a current mirror coupled to one of the at least two transistors, wherein the first and second clocks have different phases.

12. The apparatus of claim 11, wherein the first logic device is to receive a first variable input, wherein the second logic device is to receive a second variable input, wherein the third logic device is to receive a fixed input, and wherein the fourth logic device is to provide an output which is a NAND or NOR function of the first and second variable inputs.

13. The apparatus of claim 11, wherein the first logic device comprises a free magnet, wherein the second logic device comprises a free magnet, wherein the third logic device comprises a fixed magnet, and wherein the fourth logic device comprises a free magnet.

14. The apparatus of claim 11, wherein the magnetoelectric material comprises one or more of Cr, O, or multiferroic material.

15. The apparatus of claim 14, wherein the multiferroic material comprises one of $BiFeO_3$, $LuFeO_2$, $LuFe_2O_4$, or La doped $BiFeO_3$, or wherein the multiferroic material comprises one of Bi, Fe, O, Lu, or La.

16. The apparatus of claim 14, wherein the spin orbit material comprises one or more of: β-Ta, β-W, W, Pt, Cu doped with Iridium, Cu doped with Bismuth, or Cu doped with an element of 3d, 4d, 5d, 4f, or 5f periodic table groups.

17. A system comprising:
    a memory;
    a processor coupled to the memory, wherein the processor comprises a minority logic gate comprising:
        a magnet having a first portion and a second portion;
        a stack of layers, a portion of which is adjacent to the first portion of the magnet, wherein the stack of layers comprises spin orbit material;
        a layer adjacent to the second portion, the layer comprising a magnetoelectric material;
        a conductor adjacent to the layer;
        a first device coupled to the magnet, wherein the first device is controllable by a clock;
        a current mirror coupled to the first device and to a first supply node; and a second device coupled to a second supply node and to a layer of the stack of layers, wherein the second device is controllable by the clock; and a wireless interface to allow the processor to communicate with another device.

18. The system of claim 17, further comprising:

a second magnet layer having a first portion and a second portion;

a second stack of layers, a portion of which is adjacent to the first portion of the second magnet layer, wherein the second stack of layers comprises spin orbit material;

a second layer adjacent to the second portion of the second magnet layer, the second layer comprising a magnetoelectric material;

a second conductor adjacent to the second layer and to the portion of the stack of layers;

a third conductor adjacent to a portion of the second stack of layers;

a third device coupled to the second magnet, wherein the third device is controllable by a second clock;

a second current mirror coupled to the third device and the first supply node; and a fourth device coupled to the second supply node and to the second stack of layers, wherein the third device is controllable by the second clock.

19. The system of claim 18, wherein the first clock has a first phase, wherein the second clock has a second phase, and wherein the first phase is different from the second phase.

20. The system of claim 18, wherein the first, second, third, and fourth devices have a same conductivity type, or wherein the first and third devices have a first conductivity type and the second and fourth devices have a second conductivity type.

* * * * *